United States Patent
Wang et al.

(10) Patent No.: US 11,532,540 B2
(45) Date of Patent: Dec. 20, 2022

(54) PLANARIZING RDLS IN RDL-FIRST PROCESSES THROUGH CMP PROCESS

(71) Applicant: Taiwan Semiconductor Manufacturing Co., Ltd., Hsinchu (TW)

(72) Inventors: Po-Han Wang, Hsinchu (TW); Yu-Hsiang Hu, Hsinchu (TW); Hung-Jui Kuo, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/927,020

(22) Filed: Jul. 13, 2020

(65) Prior Publication Data

US 2020/0343170 A1 Oct. 29, 2020

Related U.S. Application Data

(60) Continuation of application No. 16/569,746, filed on Sep. 13, 2019, now Pat. No. 10,714,414, which is a division of application No. 15/966,655, filed on Apr. 30, 2018, now Pat. No. 10,510,645.

(51) Int. Cl.
| | |
|---|---|
| *H01L 21/768* | (2006.01) |
| *H01L 23/532* | (2006.01) |
| *H01L 23/498* | (2006.01) |
| *H01L 23/00* | (2006.01) |

(Continued)

(52) U.S. Cl.
CPC .. *H01L 23/49816* (2013.01); *H01L 21/76841* (2013.01); *H01L 21/76877* (2013.01); *H01L 23/3114* (2013.01); *H01L 23/5226* (2013.01); *H01L 23/53238* (2013.01); *H01L 24/17* (2013.01)

(58) Field of Classification Search
None
See application file for complete search history.

(56) References Cited

U.S. PATENT DOCUMENTS

| | | |
|---|---|---|
| 9,418,877 B2 | 8/2016 | Gu et al. |
| 9,425,067 B2 | 8/2016 | Lin et al. |
| 9,455,211 B2 | 9/2016 | Chiu et al. |

(Continued)

FOREIGN PATENT DOCUMENTS

| | | |
|---|---|---|
| CN | 102254897 A | 11/2011 |
| CN | 102386129 A | 3/2012 |

(Continued)

*Primary Examiner* — Bradley Smith
*Assistant Examiner* — William Henry Anderson
(74) *Attorney, Agent, or Firm* — Slater Matsil, LLP

(57) ABSTRACT

A method includes forming a buffer dielectric layer over a carrier, and forming a first dielectric layer and a first redistribution line over the buffer dielectric layer. The first redistribution line is in the first dielectric layer. The method further includes performing a planarization on the first dielectric layer to level a top surface of the first dielectric layer, forming a metal post over and electrically coupling to the first redistribution line, and encapsulating the metal post in an encapsulating material. The encapsulating material contacts a top surface of the planarized top surface of the first dielectric layer.

20 Claims, 20 Drawing Sheets

(51) Int. Cl.
*H01L 23/31* (2006.01)
*H01L 23/522* (2006.01)

(56) References Cited

U.S. PATENT DOCUMENTS

| | | | |
|---|---|---|---|
| 10,026,646 B2 | 7/2018 | Chen | |
| 10,032,722 B2 | 7/2018 | Yu et al. | |
| 10,068,847 B2 * | 9/2018 | Chen | H01L 25/04 |
| 10,134,740 B2 * | 11/2018 | Kim | H01L 27/10876 |
| 10,192,816 B2 * | 1/2019 | Kelly | H01L 21/4853 |
| 10,483,253 B1 * | 11/2019 | Hu | H01L 25/50 |
| 2008/0079163 A1 * | 4/2008 | Kurita | H01L 25/18 |
| | | | 257/E23.141 |
| 2014/0252646 A1 | 9/2014 | Hung et al. | |
| 2015/0035161 A1 | 2/2015 | Miao et al. | |
| 2015/0069623 A1 * | 3/2015 | Tsai | H01L 23/31 |
| | | | 257/774 |
| 2015/0179616 A1 | 6/2015 | Lin et al. | |
| 2015/0262909 A1 * | 9/2015 | Chen | H01L 21/76804 |
| | | | 257/774 |
| 2015/0325536 A1 * | 11/2015 | Jeng | H01L 21/283 |
| | | | 257/695 |
| 2016/0013076 A1 | 1/2016 | Vincent et al. | |
| 2016/0358865 A1 | 12/2016 | Shih et al. | |
| 2017/0005074 A1 | 1/2017 | Chen et al. | |
| 2017/0092604 A1 * | 3/2017 | Hsieh | H01L 25/105 |
| 2018/0082917 A1 | 3/2018 | Cheng et al. | |

FOREIGN PATENT DOCUMENTS

| | | |
|---|---|---|
| CN | 104576579 A | 4/2015 |
| CN | 104916605 A | 9/2015 |
| CN | 106463496 A | 2/2017 |
| CN | 107452721 A | 12/2017 |
| TW | 201633476 A | 9/2016 |

\* cited by examiner

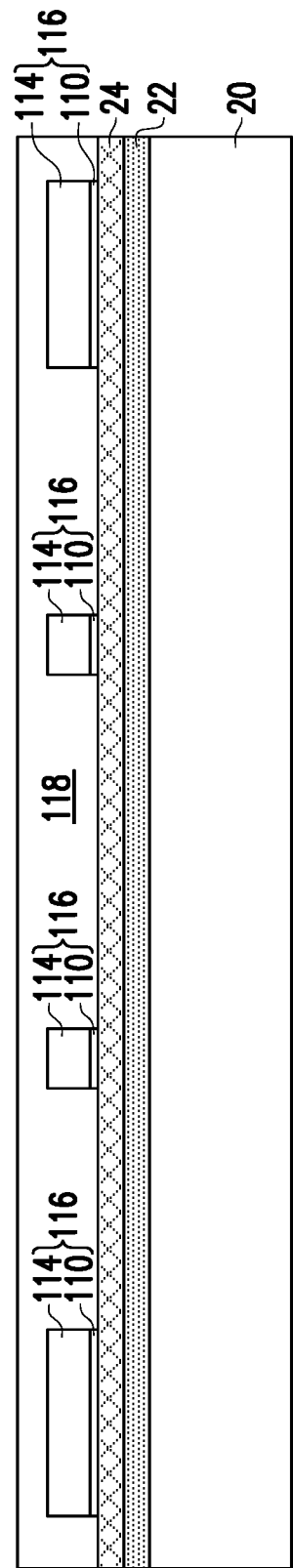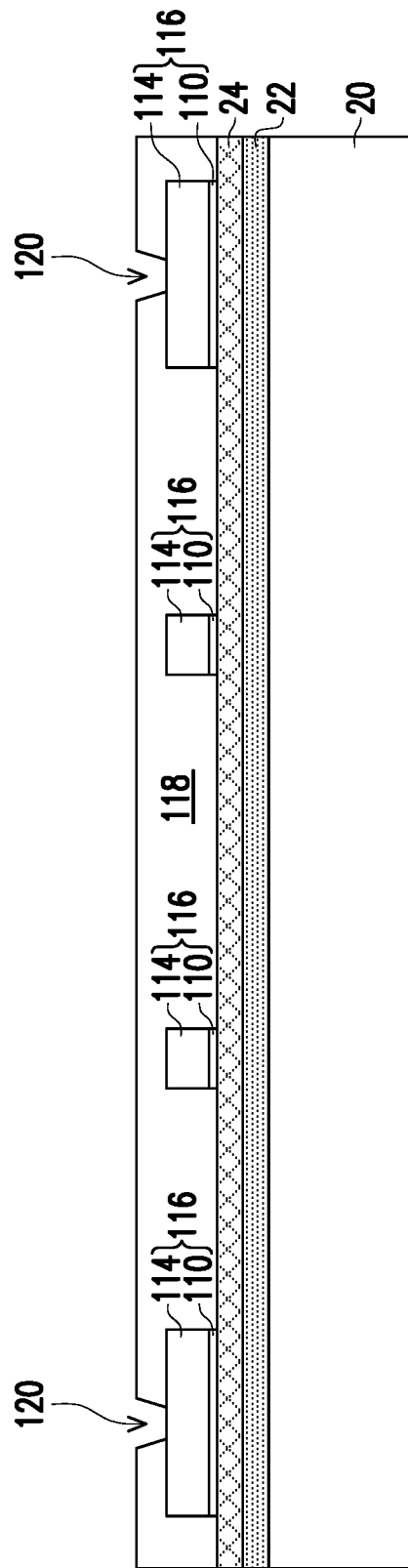

PLANARIZING RDLS IN RDL-FIRST PROCESSES THROUGH CMP PROCESS

PRIORITY CLAIM AND CROSS-REFERENCE

This application is a continuation of U.S. patent application Ser. No. 16/569,746, entitled "Planarizing RDLS in RDL-First Processes Through CMP Process," filed on Sep. 13, 2019, which is a divisional of U.S. patent application Ser. No. 15/966,655, entitled "Planarizing RDLS in RDL-First Processes Through CMP Process," filed on Apr. 30, 2018, now U.S. Pat. No. 10,510,645 issued Dec. 17, 2018, which applications are incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

In a fan-out package, a device die is encapsulated in a molding compound, which is then planarized to expose the device die. Redistribution lines are then formed to connect to the device die. The fan-out package may also include through-vias penetrating through the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 13A illustrate the cross-sectional views of intermediate stages in the formation of a package in accordance with some embodiments.

FIGS. 14 through 23 illustrate the cross-sectional views of intermediate stages in the formation of a package in accordance with some embodiments.

DETAILED DESCRIPTION

Figure 1:
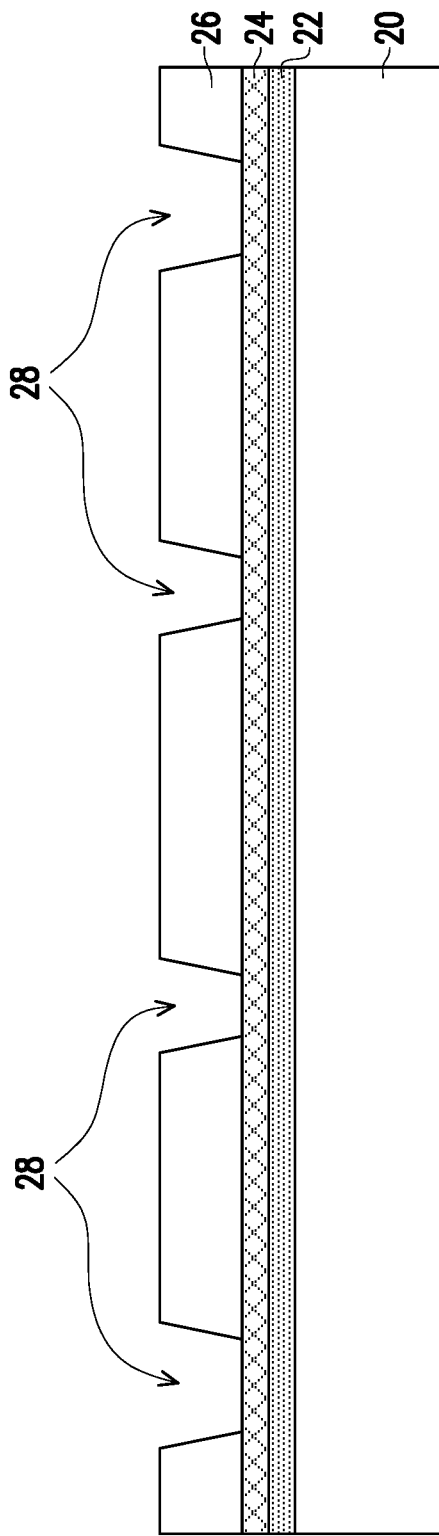

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 80 degrees or at other orientations) and the spatially relative descriptors used herein may likewise be interpreted accordingly.

A fan-out package and the method of forming the same are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

Figure 24:
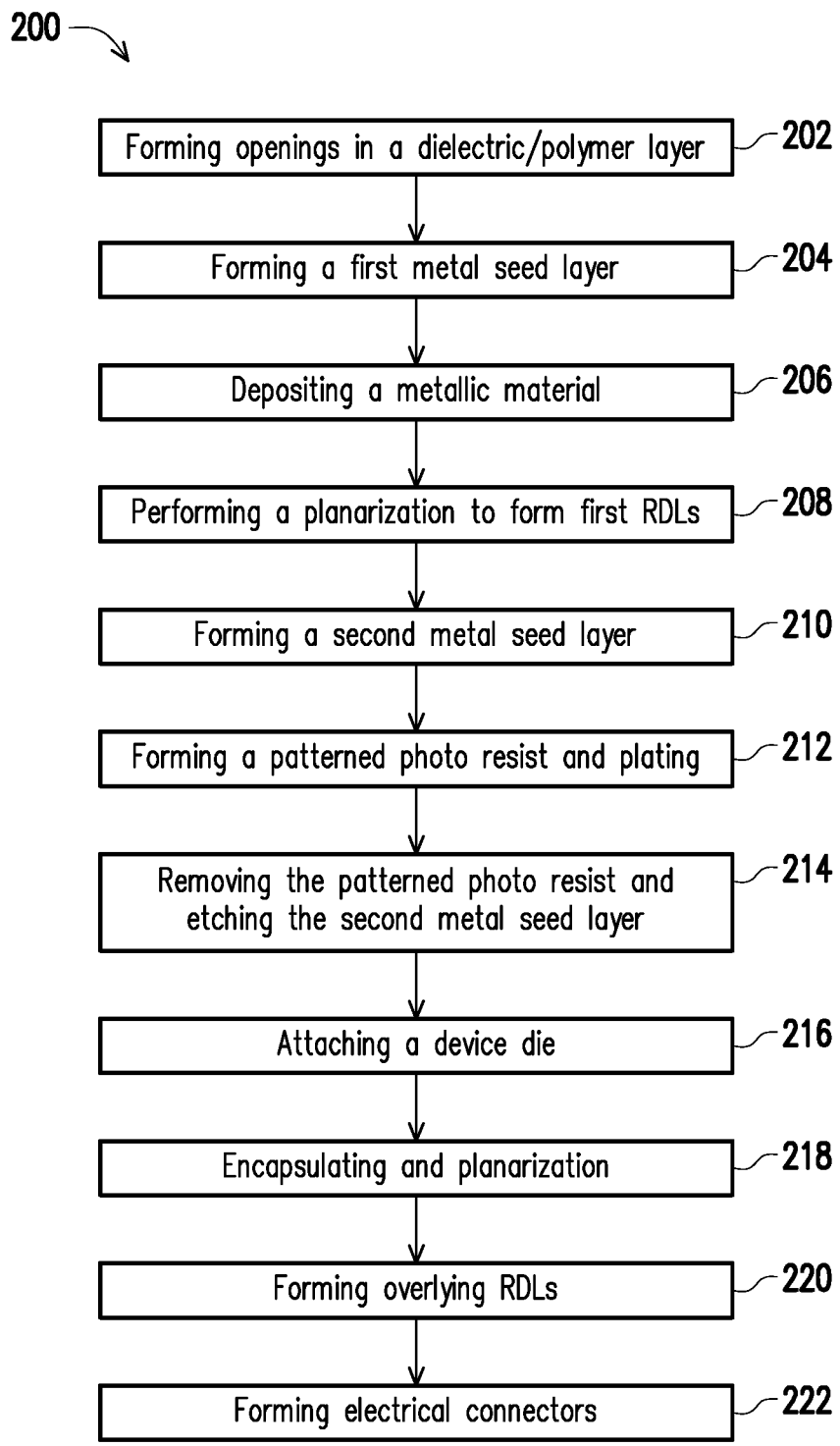
FIG. 24 illustrates a process flow for forming a package in accordance with some embodiments.

FIGS. 1 through 13A illustrate the cross-sectional views of intermediate stages in the formation of a package in accordance with some embodiments of the present disclosure. The steps shown in FIGS. 1 through 13A are also reflected schematically in the process flow 200 shown in FIG. 24.

FIG. 1 illustrates carrier 20 and release film 22 formed on carrier 20. Carrier 20 may be a glass carrier, a silicon wafer, an organic carrier, or the like. Carrier 20 may have a round top-view shape, and may have a size of a common silicon wafer. For example, carrier 20 may have an 8-inch diameter, a 12-inch diameter, or the like. Release film 22 may be formed of a polymer-based material (such as a Light-To-Heat-Conversion (LTHC) material), which may be removed along with carrier 20 from the overlying structures that will be formed in subsequent steps. In accordance with some embodiments of the present disclosure, release film 22 is formed of an epoxy-based thermal-release material. Release film 22 may be coated onto carrier 20. The top surface of release film 22 is leveled and has a high degree of planarity.

Buffer dielectric layer 24 is formed on release film 22. In accordance with some embodiments of the present disclosure, buffer dielectric layer 24 is formed of a polymer, which may also be a photo-sensitive material such as polybenzoxazole (PBO), polyimide, benzocyclobutene (BCB), or the like, that may be patterned through light exposure and development. Buffer dielectric layer 24 is cured, for example, through baking processes. In accordance with alternative embodiments of the present disclosure, dielectric layer 24 is formed of an inorganic material such as silicon oxide, silicon nitride, silicon oxynitride, silicon oxy-carbo-nitride, or the like.

Next, dielectric layer 26 is formed over dielectric layer 24. In accordance with some embodiments of the present disclosure, dielectric layer 26 is formed of a polymer, which may also be a photo-sensitive material such as PBO, polyimide, BCB, or the like. In accordance with alternative embodiments of the present disclosure, dielectric layer 26 is formed of an inorganic material such as silicon oxide, silicon nitride, silicon oxynitride, silicon oxy-carbo-nitride, or the like. Dielectric layer 26 may have a thickness greater than about 3 µm. The thickness may be in the range between about 3 µm and about 10 µm. Dielectric layers 24 and 26 may be formed of the same or different dielectric materials. Furthermore, there may be, or may not be, distinguishable interfaces between dielectric layers 24 and 26.

Further referring to FIG. 1, dielectric layer 26 is patterned to form openings 28. The respective process is illustrated as process 202 in the process flow shown in FIG. 24. In accordance with some embodiments of the present disclosure, dielectric layer 26 is formed of a photo-sensitive material, and the patterning includes light-exposing dielectric layer 26 using a lithography mask, and then developing the exposed dielectric layer 26. It is understood that when dielectric layers 24 and 26 are formed of the same light-sensitive material, since dielectric layer 24 has been adequately baked, the light-exposure and the development will not result in the patterning of dielectric layer 24. In accordance with alternatively embodiments of the present disclosure, the patterning of dielectric layer 26 includes a lithography process, which further includes forming a patterned photo resist over dielectric layer 26, and etching dielectric layer 26 using the patterned photo resist as an etching mask.

Figure 2:
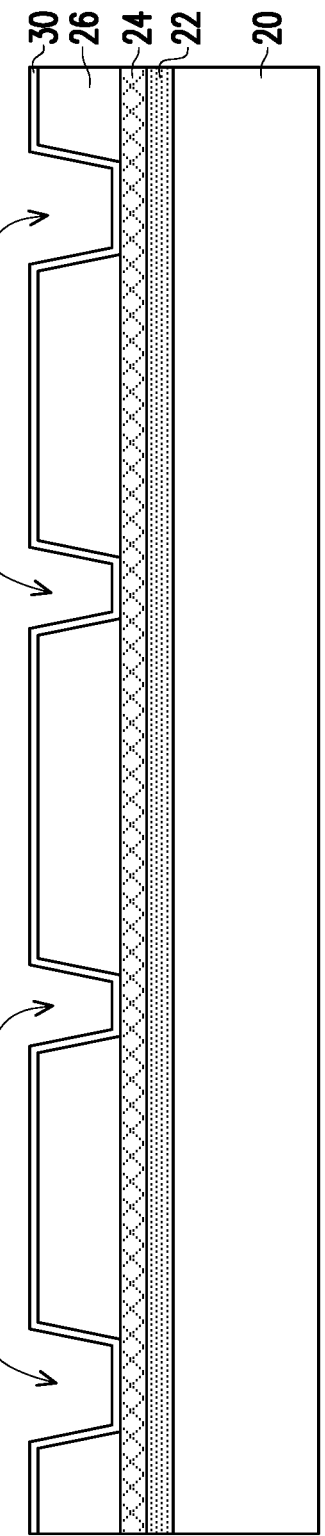

Referring to FIG. 2, metal seed layer 30 is formed, for example, through Physical Vapor Deposition (PVD). The respective process is illustrated as process 204 in the process flow shown in FIG. 24. The depositing results in the formation of the blanket metal seed layer 30, which extends into openings 28. Metal seed layer 30 is formed as a blanket layer, which may include an adhesion layer (also referred to as a diffusion barrier layer) and a copper-containing layer over the adhesion layer. The adhesion layer includes a metal different from copper, and may include titanium, tantalum, titanium nitride, tantalum nitride, or the like. The copper-containing layer may be formed of pure or substantially pure (for example, with percentage greater than about 95 percent) copper or a copper alloy. In accordance with alternative embodiments of the present disclosure, metal seed layer 30 includes titanium, tantalum, titanium nitride, tantalum nitride, or the like, and does not include the copper-containing layer.

Figure 3:
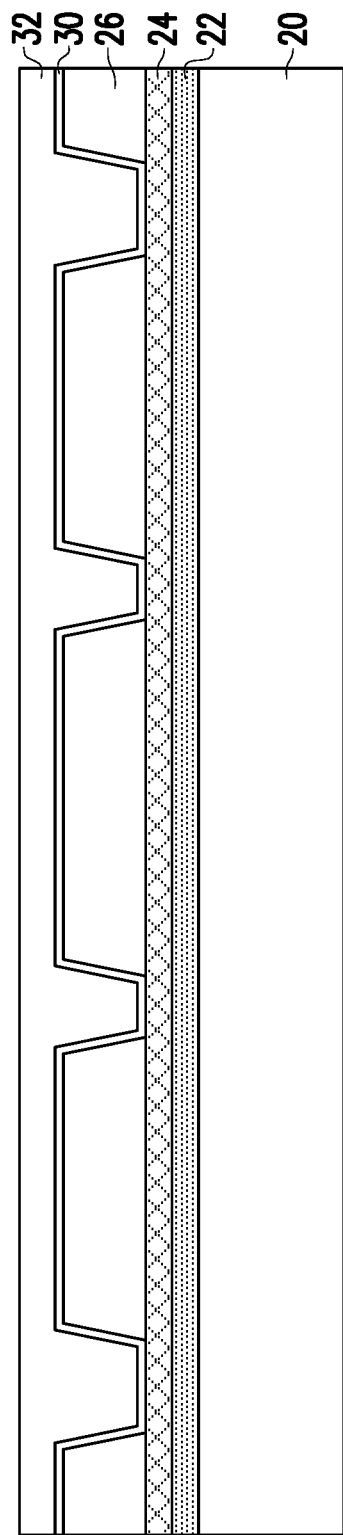

FIG. 3 illustrates the deposition of metallic material 32. The respective process is illustrated as process 206 in the process flow shown in FIG. 24. In accordance with some embodiments, metallic material 32 is deposited through a plating process such as an electro-chemical plating (ECP) process or an electro-less plating process, a physical vapor deposition process, or a chemical vapor deposition process. Metallic material 32 may be formed of pure or substantially pure (for example, with a percentage greater than about 95 percent) copper or a copper alloy.

Figure 4:
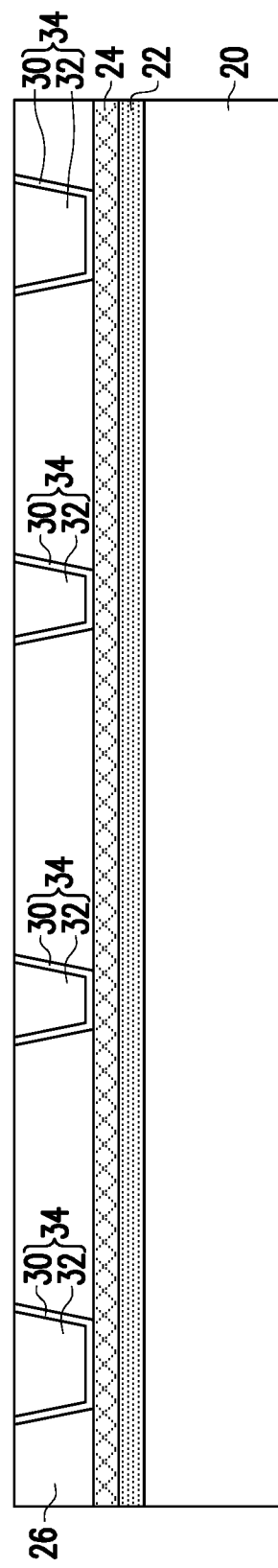

Referring to FIG. 4, a planarization process such as a Chemical Mechanical Polish (CMP) process or a mechanical polish process is performed. Excess portions of seed layer 30 and metallic material 32 over the top surface of dielectric layer 26 are thus removed. The respective process is illustrated as process 208 in the process flow shown in FIG. 24. The remaining portions of seed layer 30 and metallic material 32 are referred to as Redistribution Lines (RDLs) 34. RDLs 34 may include metal traces and metal pads, depending on whether the respective portions of RDLs 34 are used for electrical routing purpose or bonding/landing purpose. The top surfaces and top edges of seed layer 30, metallic material 32, and dielectric layer 26 are thus coplanar.

As a result of the planarization process, the top surfaces of RDLs 34 and dielectric layer 26 may have polishing marks, which are the scratches (strip-shaped voids) extending into RDLs 34 and dielectric layer 26. The polishing marks indicate that a planarization process has been performed on RDLs 34 and dielectric layer 26.

Figure 5:
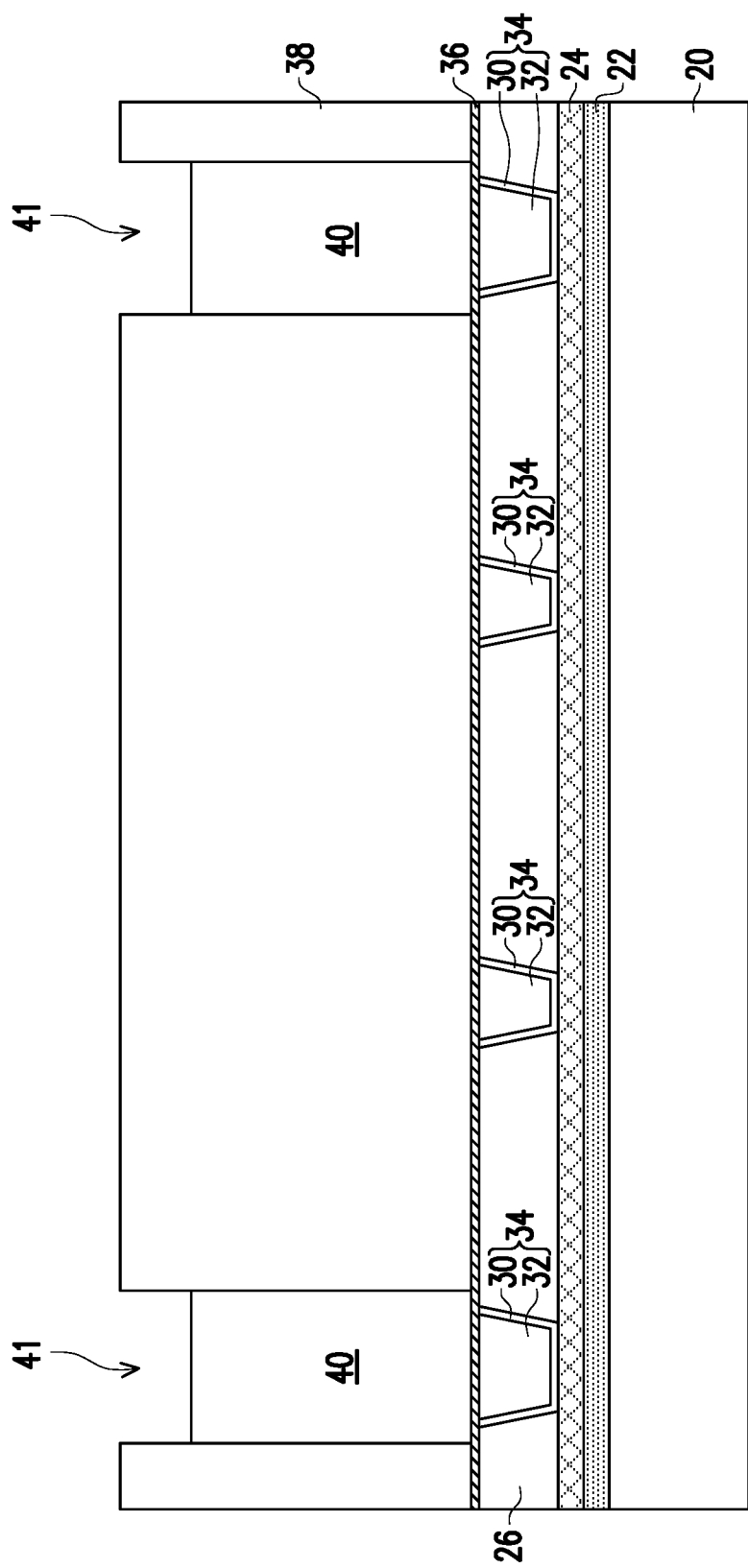
Figure 6:
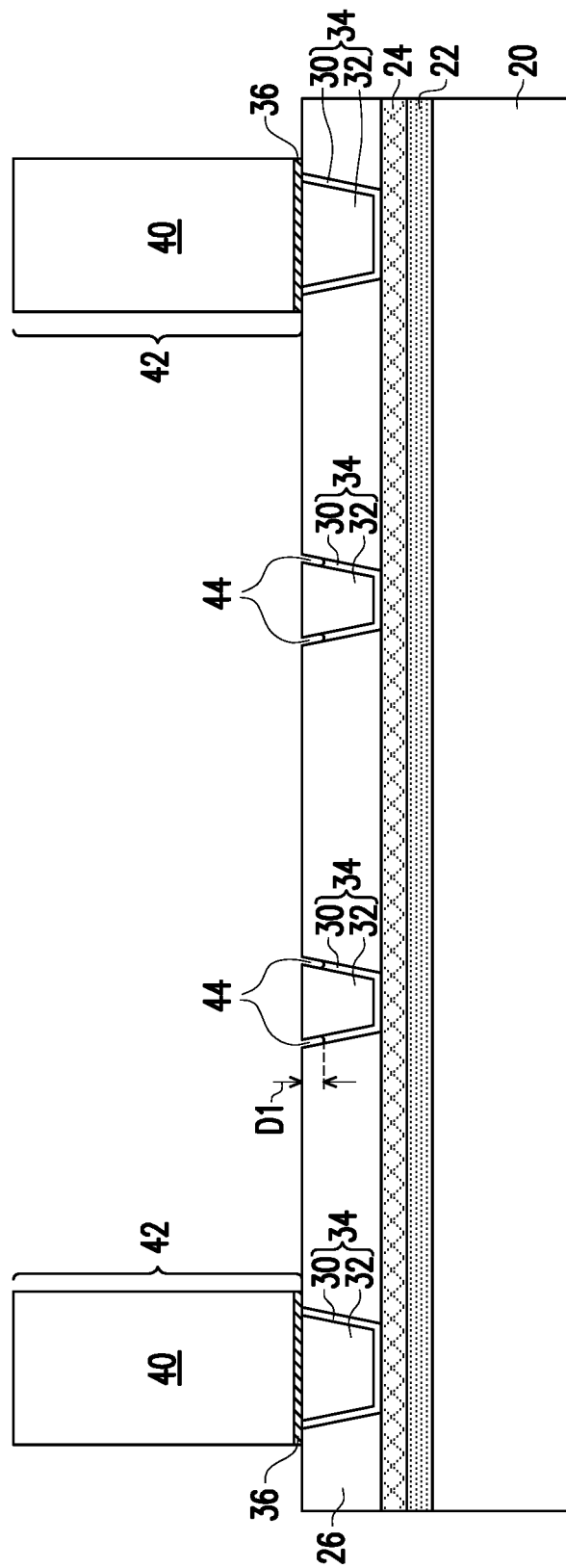

FIGS. 5 and 6 illustrate the formation of metal posts 42 (FIG. 6). Referring to FIG. 5, metal seed layer 36 is formed, for example, through Physical Vapor Deposition (PVD). The respective process is illustrated as process 210 in the process flow shown in FIG. 24. Metal seed layer 36 is formed as a blanket and planar layer. Metal seed layer 36 may also include an adhesion layer and a copper-containing layer over the adhesion layer. The adhesion layer includes a metal different from copper, and may include titanium, tantalum, titanium nitride, tantalum nitride, or the like. The copper-containing layer may be formed of pure or substantially pure copper (for example, with copper percentage greater than about 95 percent) or a copper alloy.

Patterned photo resist 38 is formed over metal seed layer 36. The respective process is illustrated as process 212 in the process flow shown in FIG. 24. A light-exposure is then performed on photo resist 38 using a photo lithography mask, followed by a development step to form openings 41, through which metal seed layer 36 is exposed.

Next, metal posts 40 are formed, for example, by plating a metallic material in openings 41. The respective process is also illustrated as process 212 in the process flow shown in FIG. 24. The plated metallic material may be copper or a copper alloy. The top surfaces of metal posts 40 are lower than the top surface of photo resist 38, so that the shapes of metal posts 40 are confined by openings 41. Metal posts 40 may have substantially vertical and straight edges. Alternatively, metal posts 40 may have a sand timer shape in a cross-sectional view, with the middle parts of metal posts 40 being narrower than the respective top parts and bottom parts.

In a subsequent step, the patterned photo resist 38 is removed, and hence the underlying portions of metal seed layer 36 are exposed. The exposed portions of metal seed layer 36 are then removed in an etching step, for example, in an anisotropic etching step or an isotropic etching step. The respective process is illustrated as process 214 in the process flow shown in FIG. 24. The resulting structure is shown in FIG. 6. The edges of the remaining seed layer 36 may thus be flush with or substantially flush with the respective overlying portions of metal posts 40, or may be laterally recessed from the respective edges of the overlying portions of metal posts 40, hence having undercuts. The resulting metal posts 40 are illustrated in FIG. 6. Metal posts 40 and the underlying remaining portions of metal seed layer 36 are collectively referred to as metal posts 42. The top-view shapes of metal posts 42 include, and are not limited to, circular shapes, rectangles, hexagons, octagons, and the like. Metal posts 42 are alternatively referred to as through-vias or through-molding vias since they will penetrate through the subsequently formed encapsulating material (which may be a molding compound) in the final package. After the formation of metal posts 42, the top dielectric layer 26 is re-exposed.

During the etching of metal seed layer 36, recesses 44 may be formed, which is the result of the etching of the adhesion layer in metal seed layer 30 in RDLs 34. For example, when metal seed layer 30 and metal seed layer 36 include the same or similar material (such as titanium), the etching of metal seed layer 36, which includes an over-etching to ensure the removal of the undesirable portions of metal seed layer 36, also results in the recessing of the top edge portions of the adhesion layer in metal seed layer 30. Recesses 44 may have a depth greater than about 0.2 µm, and the depth may be in the range between about 0.2 µm and about 0.5 µm. When the materials of metal seed layer 30 and metal seed layer 36 are different and have a high etching selectivity during the etching of metal seed layer 36, recesses may not be formed. Recesses 44 are formed on the portions of metal seed layer 30 that are exposed to the etching, while the portions of metal seed layer 30 protected by metal posts 42 are not etched, and no recesses are formed.

Figure 7:
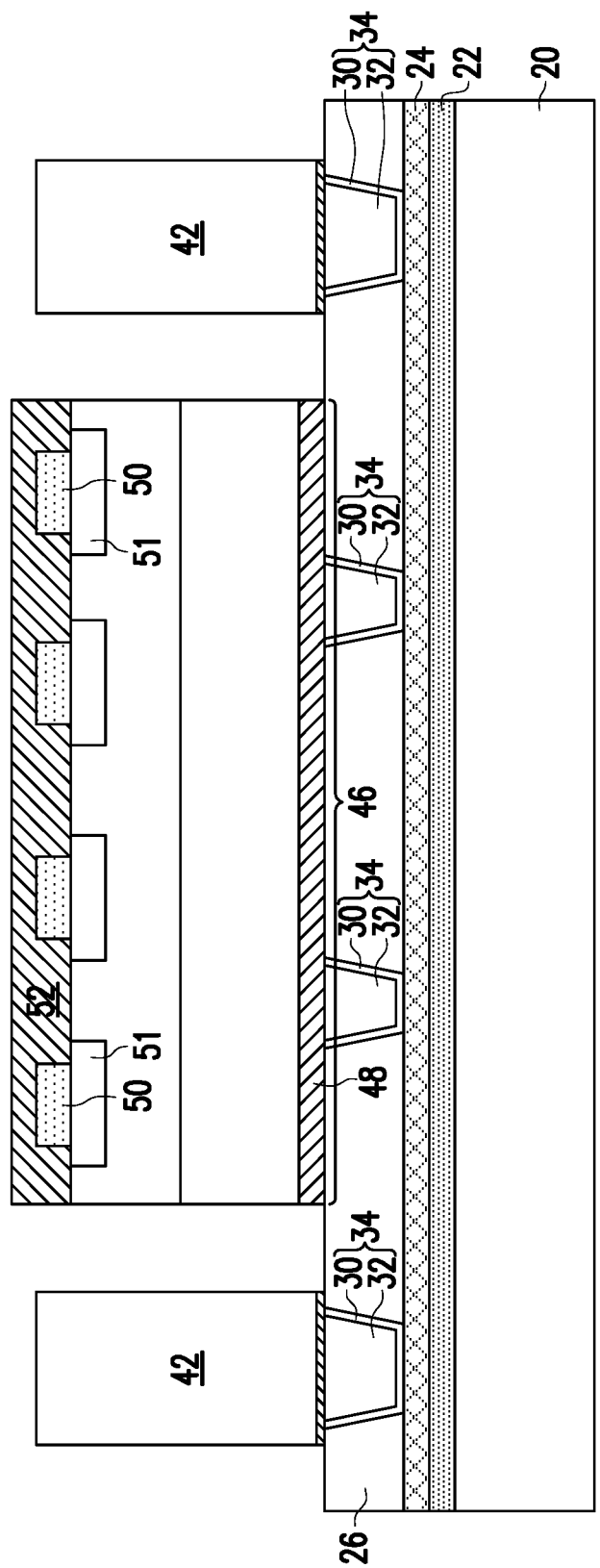

FIG. 7 illustrates the placement/attachment of device 46 (alternatively referred to as package components). The respective process is illustrated as process 216 in the process flow shown in FIG. 24. Device 46 may be a device die, and hence is referred to as device die 46 hereinafter, while device 46 may also be a package, a die stack, or the like. Device die 46 is attached to dielectric layer 26 and RDLs 34 through Die-Attach Films (DAF) 48, which is an adhesive film pre-attached on device die 46 before device die 46 is placed on dielectric layer 26. The DAF 48 may be sawed along with the wafer in which device die 46 is sawed from, and hence the edges of DAF 48 are flush with the respective edges of device die 46. Device die 46 may include a semiconductor substrate having a back surface (the surface facing down) in physical contact with the respective underlying DAF 48. Device die 46 may include integrated circuit devices such as active devices, which include transistors at the front surface (the surface facing up) of the semiconductor substrate. In accordance with some embodiments of the present disclosure, device die 46 includes one or more logic die, which may be a Central Processing Unit (CPU) die, a Graphic Processing Unit (GPU) die, a mobile application die, a Micro Control Unit (MCU) die, an input-output (IO) die, a BaseBand (BB) die, or an Application processor (AP) die. Since carrier 20 is a wafer-level carrier, although one device die 46 is illustrated, a plurality of device dies 46 may be placed over dielectric layer 26 in the die-placement step, and the device dies may be allocated as an array including a plurality of rows and a plurality of columns.

In accordance with some exemplary embodiments, metal pillars 50 (such as copper pillars) are pre-formed as parts of device die 46, and metal pillars 50 are electrically coupled to the integrated circuit devices such as transistors in device die 46 through the underlying metal pads 51, which may be, for example, aluminum copper pads. In accordance with some embodiments of the present disclosure, a dielectric layer such as polymer layer 52 fills the gaps between neighboring metal pillars 50 to form a top dielectric layer. Top dielectric layer 52 may also include a portion covering and protecting metal pillars 50. Polymer layer 52 may be formed of PBO or polyimide in accordance with some embodiments of the present disclosure.

Figure 17:
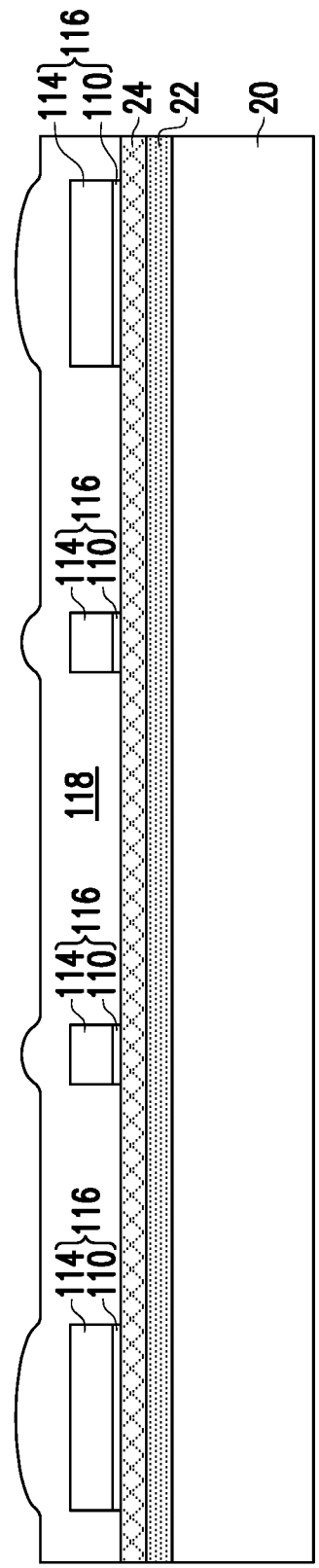

In accordance with some embodiments of the present disclosure, due to the planarization process as shown in FIG. 4, the top surfaces and the top edges of seed layer 30, metallic material 32, and dielectric layer 26 are coplanar, and hence DAF 48 is adhered to a planar top surface. No voids (which may be air gaps) are formed between DAF 48 and the underlying structure. This results in the improvement in the reliability of the resulting package. As a comparison, if no planarization is performed, DAF 48 would be placed on a non-planar top surface such as what is shown in FIG. 17, voids (air gaps) would be formed between DAF 48 and the underlying structure, and the reliability of the package is compromised.

Figure 8:
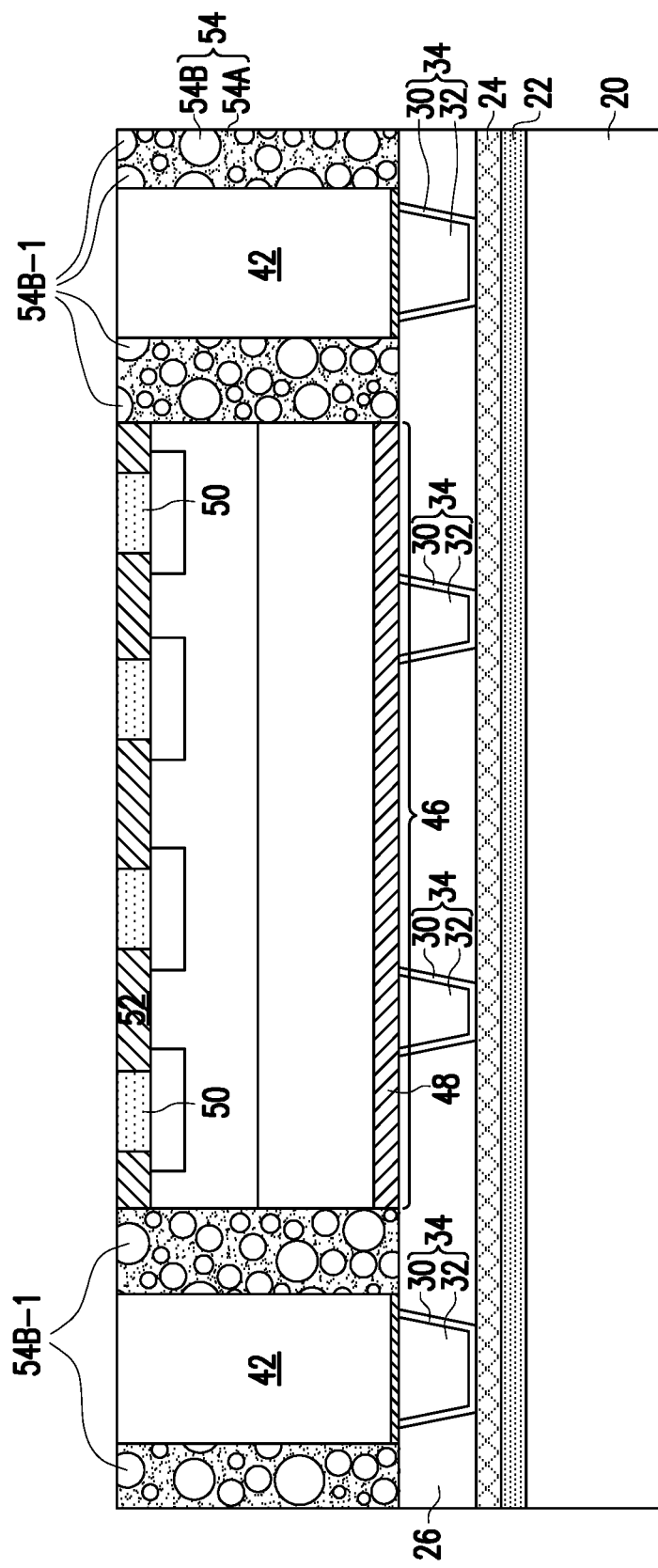

Next, referring to FIG. 8, device die 46 and metal posts 42 are encapsulated in encapsulating material 54. The respective process is illustrated as process 218 in the process flow shown in FIG. 24. Metal posts 42 penetrate through encapsulating material 54, and are referred to as through-vias thereinafter. Encapsulating material 54 fills the gaps between neighboring through-vias 42 and the gaps between through-vias 42 and device die 46. Encapsulating material 54 may be a molding compound, a molding underfill, an epoxy, and/or a resin. After the encapsulation, the top surface of encapsulating material 54 is higher than the top ends of metal pillars 50 and through-vias 42. Encapsulating material 54 may include base material 54A, which may be a polymer, a resin, an epoxy, or the like, and filler particles 54B in base material 54A. The filler particles may be the particles of a dielectric material(s) such as $SiO_2$, $Al_2O_3$, silica, or the like, and may have spherical shapes. Also, the spherical filler particles 54B may have the same or different diameters, as illustrated in accordance with some examples. In accordance with some embodiments, some recesses 44 (not shown) are not covered by DAF 48. These recesses 44 may be filled by encapsulating material 54, or may be partially filled and leaving some remaining left as air gaps.

In a subsequent step, as also shown in FIG. 8, a planarization process such as a Chemical Mechanical Polish (CMP) process or a mechanical grinding process is performed to thin encapsulating material 54 and dielectric layer 52, until through-vias 42 and metal pillars 50 are all exposed. Through-vias 42 and metal pillars 50 may also be polished slightly to ensure the exposure of both through-vias 42 and metal pillars 50. Due to the planarization process, the top ends of through-vias 42 are level (coplanar) with or substantially level with the top surfaces of metal pillars 50, and are substantially coplanar with the top surface of encapsulating material 54. Due to the planarization process, some filler particles 54B at the top of the molded encapsulating material 54 are polished partially, causing some of the filler particles to have the top portions removed, and bottom portions remaining, as shown as 54B-1 in FIG. 8. The resulting partial filler particles 54B-1 will thus have top surfaces to be planar, which planar top surfaces are coplanar with the top surface of base material 54A, through-vias 42, and metal pillars 50.

Figure 9:
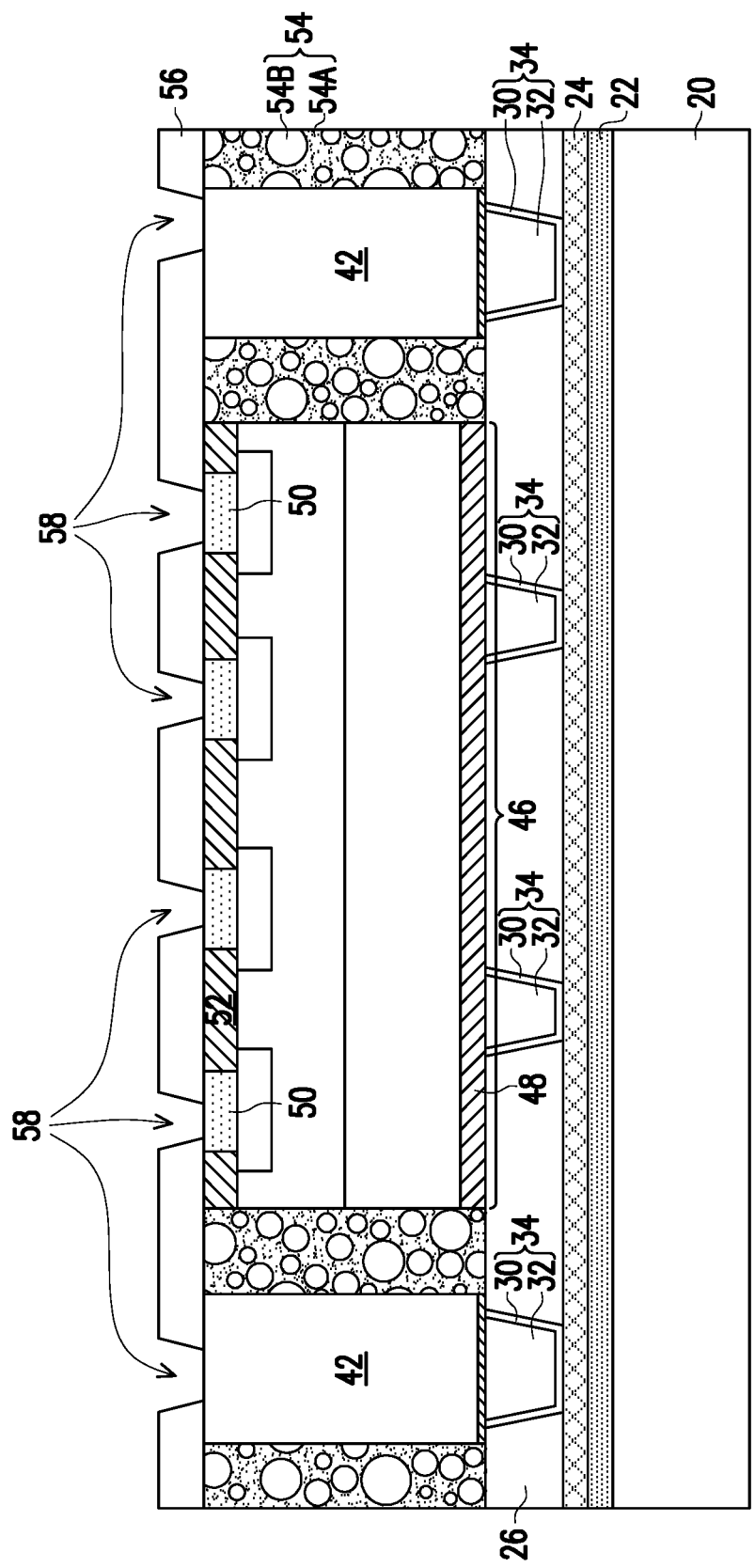
Figure 10:
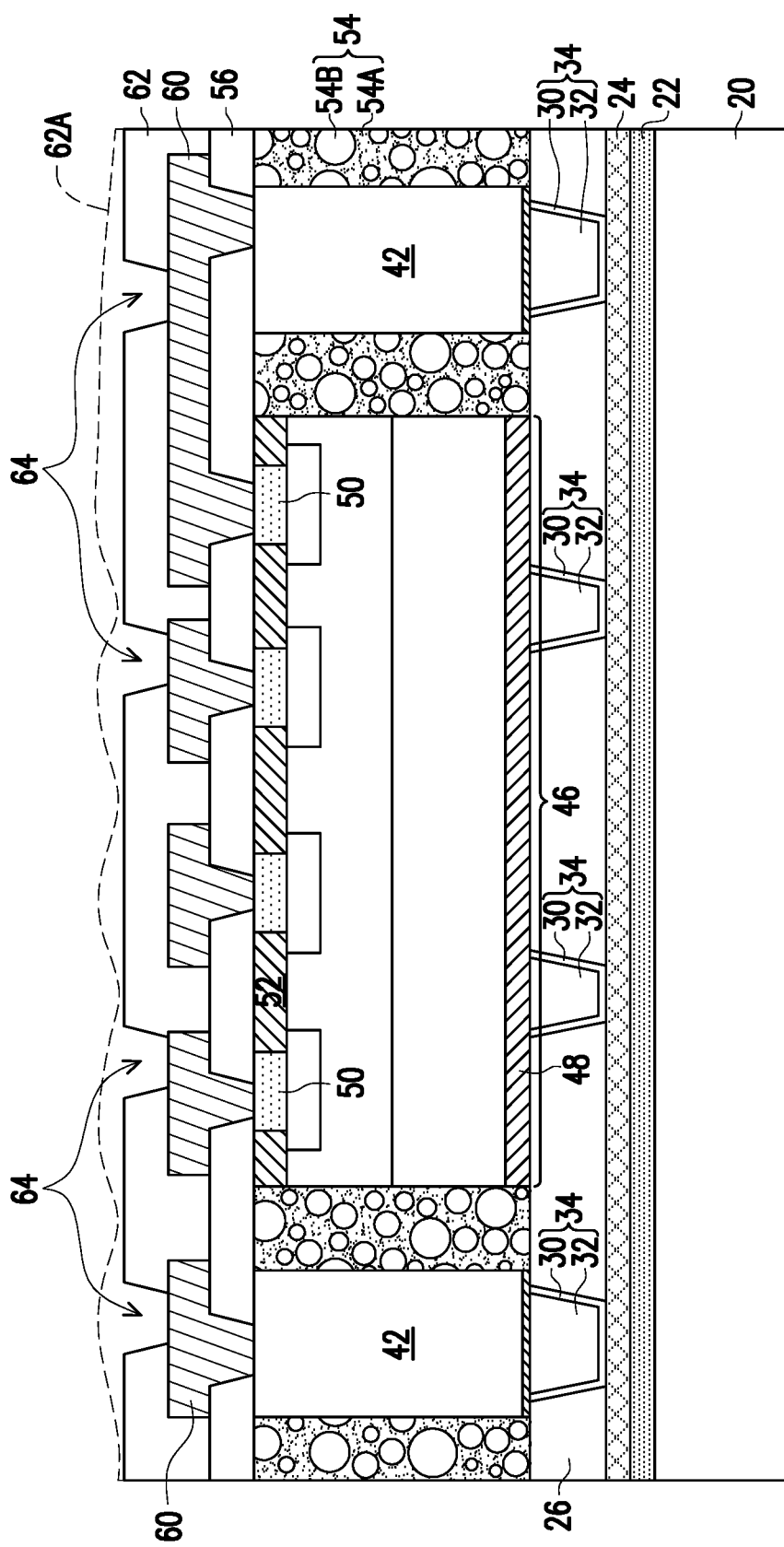
Figure 11:
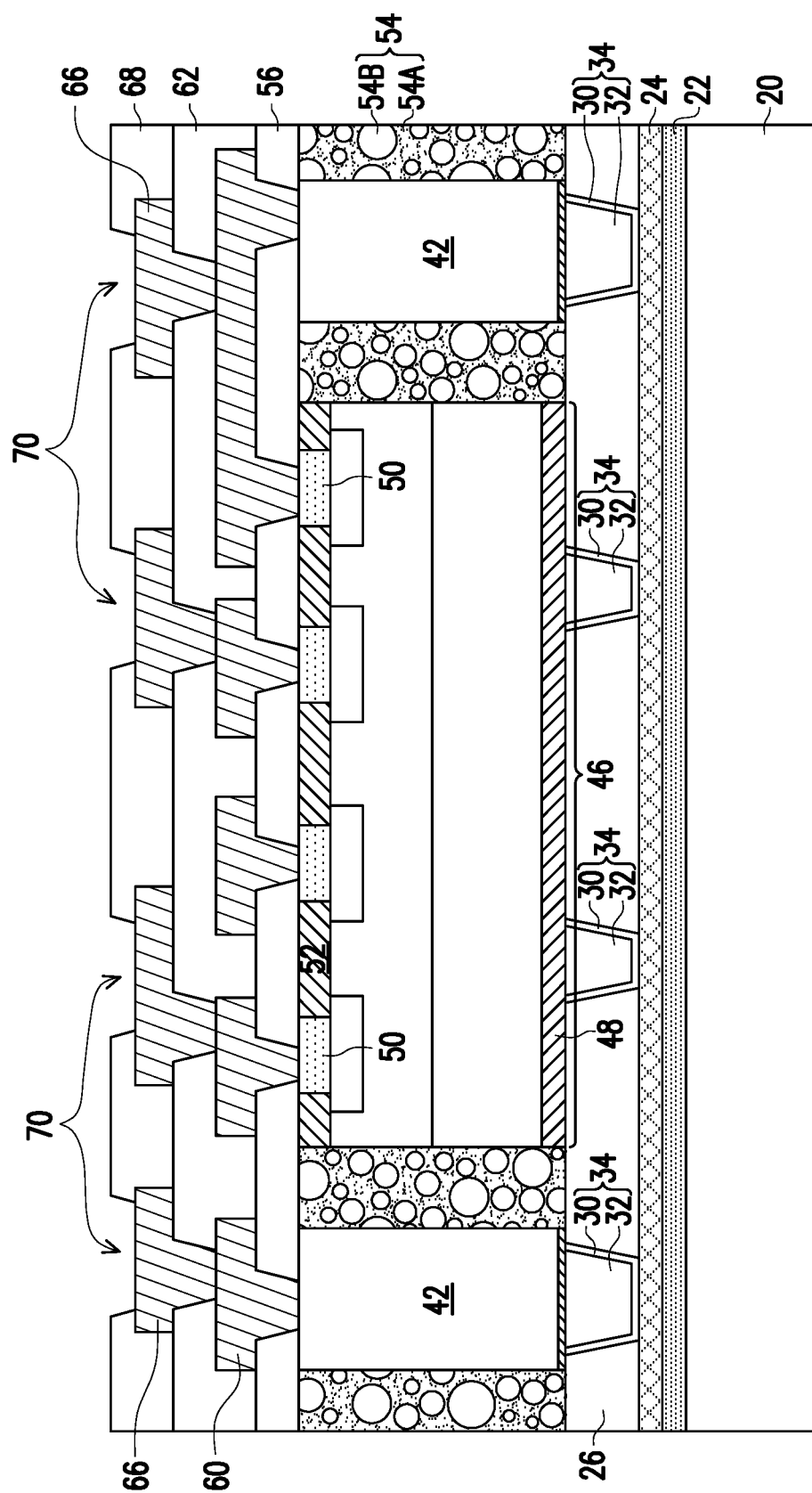

FIGS. 9 through 11 illustrate the formation of front-side RDLs. The respective process is illustrated as process 220 in the process flow shown in FIG. 24. Referring to FIG. 9, dielectric layer 56 is formed. In accordance with some embodiments of the present disclosure, dielectric layer 56 is formed of an organic dielectric material such as a polymer, which may be PBO, polyimide, or the like. In accordance with alternative embodiments of the present disclosure, dielectric layer 56 is formed of an inorganic dielectric material such as silicon nitride, silicon oxide, or the like. Openings 58 are formed in dielectric layer 56 to expose through-vias 42 and metal pillars 50. Openings 58 may be formed through a photo lithography process (etching with a photo resist to define pattern), or a light-exposure process and a subsequent development process.

Next, referring to FIG. 10, RDLs 60 are formed to connect to metal pillars 50 and through-vias 42. RDLs 60 may also interconnect metal pillars 50 and through-vias 42. RDLs 60 include metal traces (metal lines) over dielectric layer 56 as well as vias extending into openings 58 (FIG. 9) to electrically connect to through-vias 42 and metal pillars 50. In accordance with some embodiments of the present disclosure, RDLs 60 are formed in a plating process, wherein each of RDLs 60 includes a seed layer and a plated metallic material over the seed layer. The seed layer and the plated material may be formed of the same material or different materials. RDLs 60 may comprise a metal or a metal alloy including copper, aluminum, tungsten, and alloys thereof. RDLs 60 are formed of non-solder materials.

Further referring to FIG. 10, dielectric layer 62 is formed over RDLs 60 and dielectric layer 56. Dielectric layer 62 may be formed using an organic material, which may be selected from the same candidate materials as those of dielectric layer 56. For example, dielectric layer 62 may comprise PBO, polyimide, BCB, or the like. Alternatively, dielectric layer 62 may include non-organic dielectric materials such as silicon oxide, silicon nitride, silicon carbide, silicon oxynitride, or the like. Openings 64 are also formed in dielectric layer 62 to expose RDLs 60. Openings 64 may be formed through a photo lithography process. In accordance with some embodiments of the present disclosure, dielectric layer 62 is not planarized, and the top surface of dielectric layer 62 is non-planar. For example, dashed line 62A schematically illustrates the topology of the top surface of dielectric layer 62. In subsequent drawings, the top surface of dielectric layer 62 is illustrated as being planar for simplicity, while the actual top surface may be non-planar.

FIG. 11 illustrates the formation of RDLs 66, which are electrically connected to RDLs 60. The formation of RDLs 66 may adopt similar methods and materials as those for forming RDLs 60. RDLs 66 and 60 are also referred to as front-side RDLs since they are located on the front side of device die 46.

As shown in FIG. 11, an additional dielectric layer 68 is formed to cover RDLs 66 and dielectric layer 62. Dielectric layer 68 may be formed of a materials selected from the same candidate materials for forming dielectric layers 62 and 56. Openings 70 are then formed in dielectric layer 68 to expose the metal pad portions of RDLs 66. In accordance with some embodiments, since no device die is adhered over dielectric layers 62 and 68 through a DAF, dielectric layers 62 and 68 are not planarized, and the top surfaces of dielectric layers 62 and 68 are non-planar, which are similar to the schematically illustrated top non-planar top surface 62A of dielectric layer 62 in FIG. 10.

Figure 12:
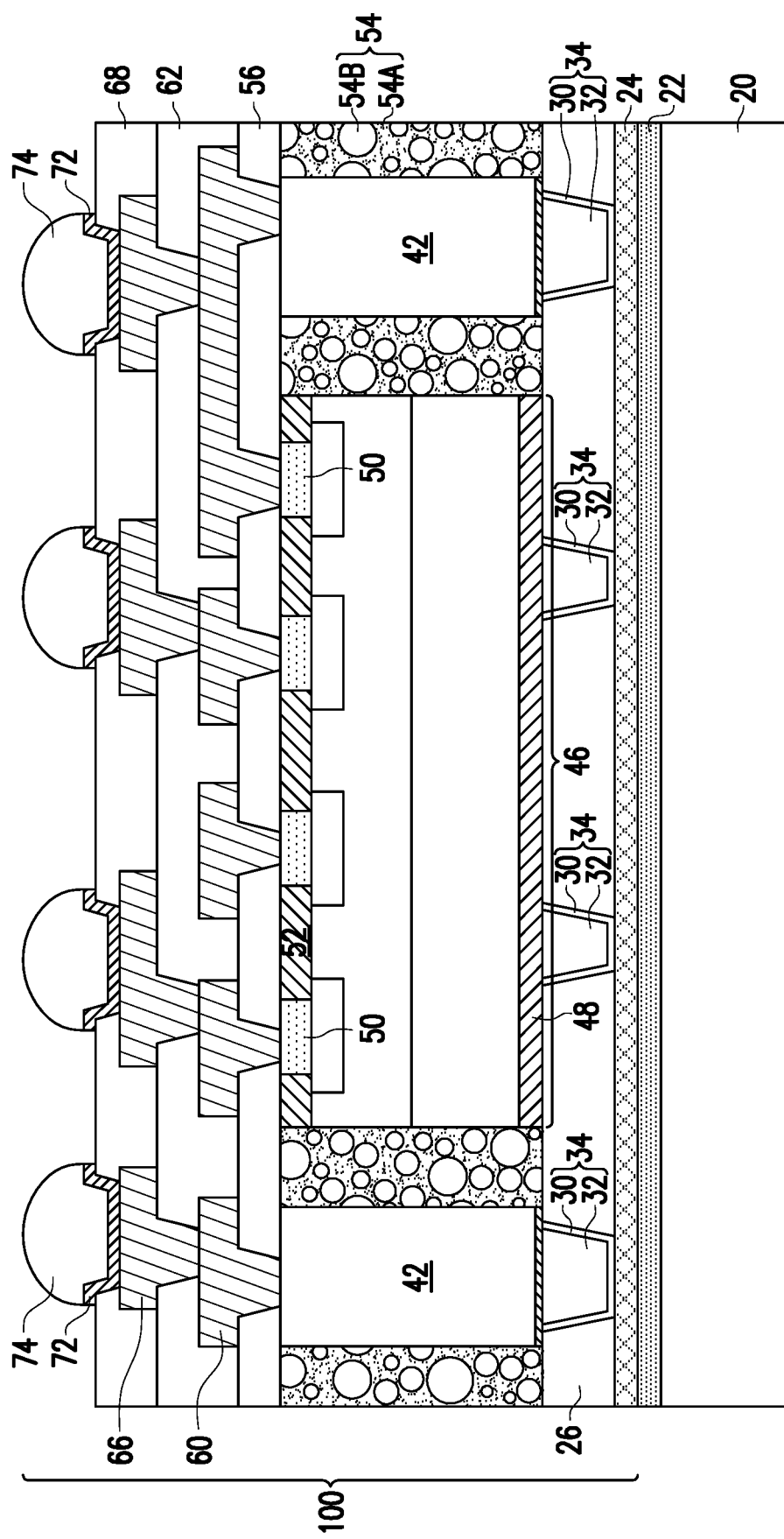

FIG. 12 illustrates the formation of Under-Bump Metallurgies (UBMs) 72 and electrical connectors 74 in accordance with some exemplary embodiments. The respective process is illustrated as process 222 in the process flow shown in FIG. 24. The formation of UBMs 72 may include a deposition process and a patterning process. The formation of electrical connectors 74 may include placing solder balls on the exposed portions of UBMs 72 and then reflowing the solder balls. In accordance with alternative embodiments of the present disclosure, the formation of electrical connectors 74 includes performing a plating step to form solder regions over UBMs 72 and then reflowing the solder regions. Electrical connectors 74 may also include metal pillars or the combined structures of metal pillars and solder caps, which may also be formed through plating. Throughout the description, the combined structure including device die 46, through-vias 42, molding material 54, and the corresponding RDLs and dielectric layers is referred to as package 100, which may be a composite wafer with a round top-view shape.

Next, package 100 is de-bonded from carrier 20. Composite wafer 100 is placed on a tape, so that composite wafer 100 may be demounted from carrier 20, for example, by projecting a light (such a laser beam) on release film 22, and the light penetrates through the transparent carrier 20. The release film 22 is thus decomposed, and composite wafer 100 is released from carrier 20.

Figure 13A:
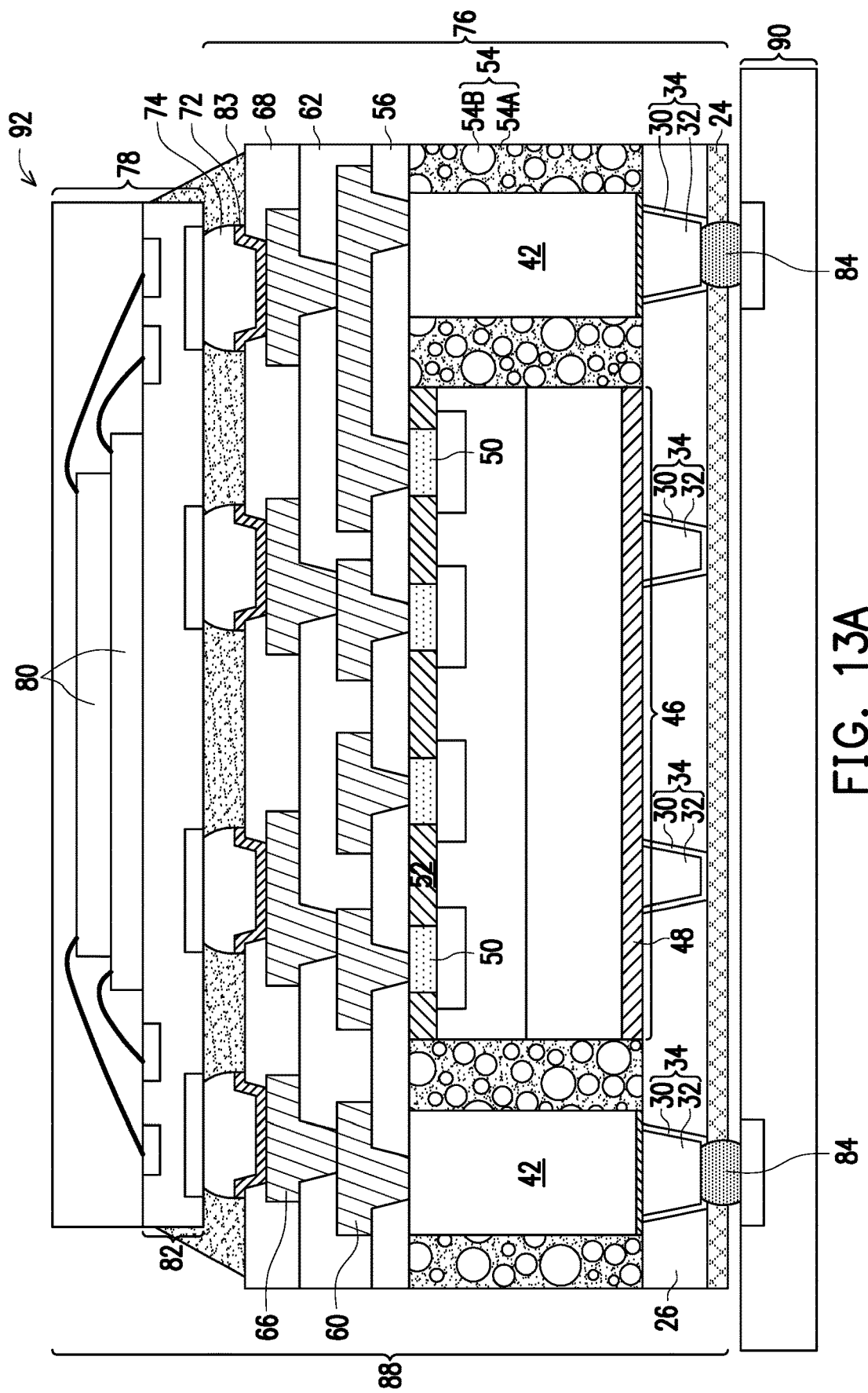

Referring to FIG. 13A, openings (occupied by solder regions 84) are formed in dielectric buffer layer 24, and hence the metal seed layer 30 of RDLs 34 is exposed. In accordance with some embodiments of the present disclosure, the openings are formed through laser drill. In accordance with alternative embodiments of the present disclosure, the openings are formed through etching in a lithography process. The adhesion layer in metal seed layer 30 is then etched through, revealing metallic material 32.

Composite wafer 100 includes a plurality of packages 76, which are identical to each other, with each of packages 76 including a plurality of through-vias 42 and one or more device die 46. FIG. 13A also illustrates the bonding of package 78 onto package 76, thus forming a Package-on-Package (PoP) structure/package 88. The bonding is performed through solder regions 74. In accordance with some embodiments of the present disclosure, package 78 includes package substrate 82 and device die(s) 80, which may be memory dies such as Static Random Access Memory (SRAM) dies, Dynamic Random Access Memory (DRAM) dies, or the like. Underfill 83 is also disposed into the gap between package 78 and the underlying package 76, and is cured. A singulation (die-saw) process is performed to separate composite wafer 100 and the packages 78 bonded thereon into individual packages 88, which are identical to each other.

FIG. 13A also illustrates the bonding of the singulated package 88 to package component 90 through solder regions 84. In accordance with some embodiments of the present disclosure, package component 90 is a package substrate, which may be a coreless substrate or a substrate having a core (such as a fiberglass-reinforced core). In accordance with other embodiments of the present disclosure, package component 90 is a printed circuit board or a package. The package in FIG. 13A is referred to as package 92 hereinafter.

Figure 13B:
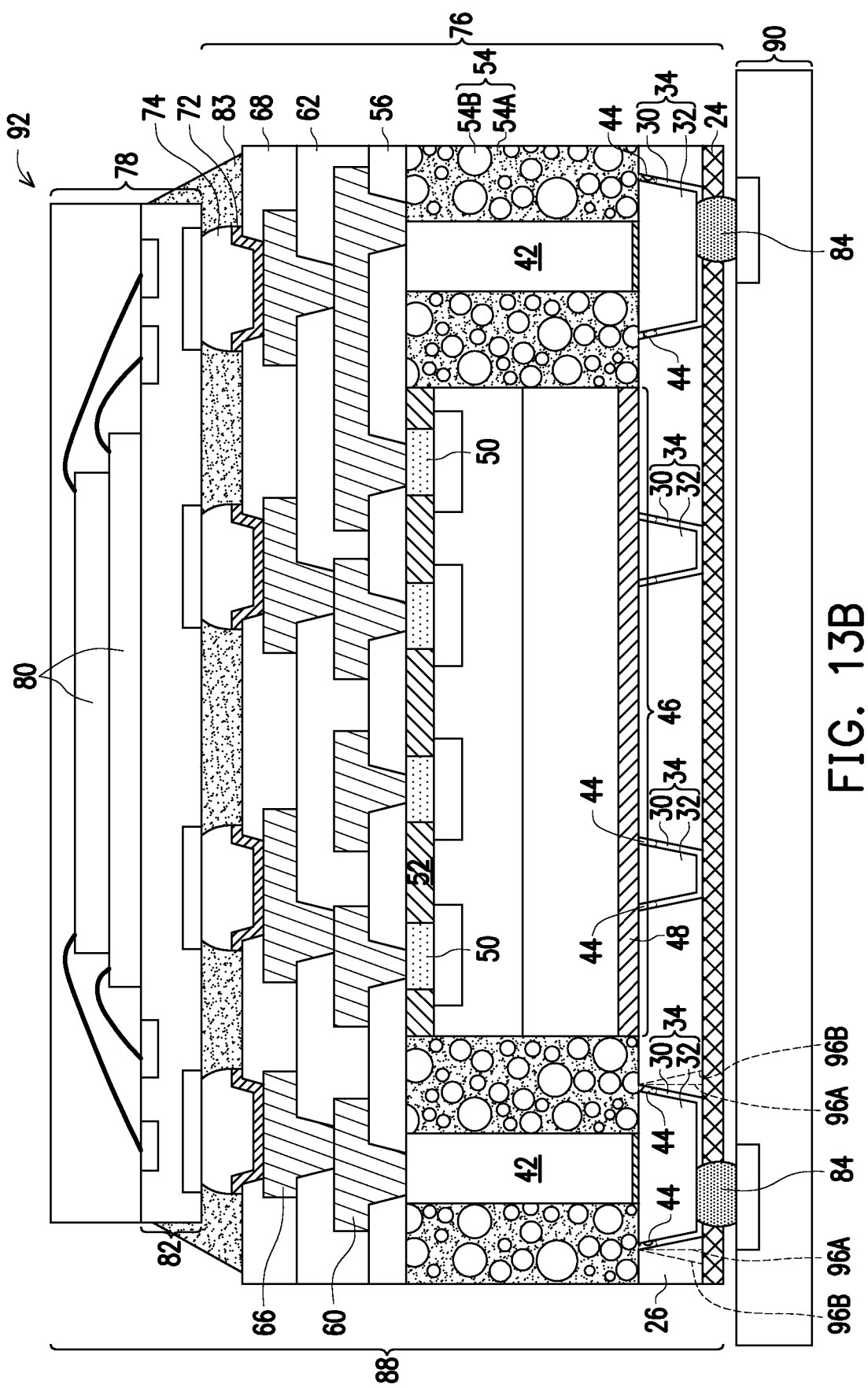
FIG. 13B illustrates a cross-sectional view of a package in accordance with some embodiments.

FIG. 13B illustrates the package 92 in accordance with alternative embodiments of the present disclosure. These embodiments are similar to the embodiments shown in FIG. 13A, except that through-vias 42 may be narrower than the underlying RDLs 34. Accordingly, the top edges of metal seed layer 30 are in contact with molding material 54. In some embodiments, the top edges of metal seed layer 30 are recessed in the step shown in FIG. 6. Accordingly, recesses 44 (as represented by dashed lines) are formed to extend into the top portions of the adhesion layer, and recesses 44 extend into the top portions of seed layer 30.

FIG. 13B illustrates that the cross-sectional views of RDLs 34 have an inverted trapezoid profile. In accordance with alternative embodiments, the cross-sectional views of RDLs 34 may have vertical edges, as illustrated by dashed lines 96A, which represent the sidewalls of the corresponding RDLs 34. In accordance with yet alternative embodiments, the cross-sectional views of RDLs 34 may have a trapezoid profile, as illustrated by dashed lines 96B, which represent the sidewalls of the corresponding RDLs 34.

FIGS. 14 through 23 illustrate the cross-sectional views of packages formed in accordance with alternative embodiments of the present disclosure. Unless specified otherwise, the materials and the formation methods of the components in these embodiments are essentially the same as the like components, which are denoted by like reference numerals in the embodiments shown in FIGS. 1 through 13A and 13B. The details regarding the formation process and the materials of the components shown in FIGS. 14 through 23 may thus be found in the discussion of the embodiment shown in FIGS. 1 through 13A/13B.

Figure 14:
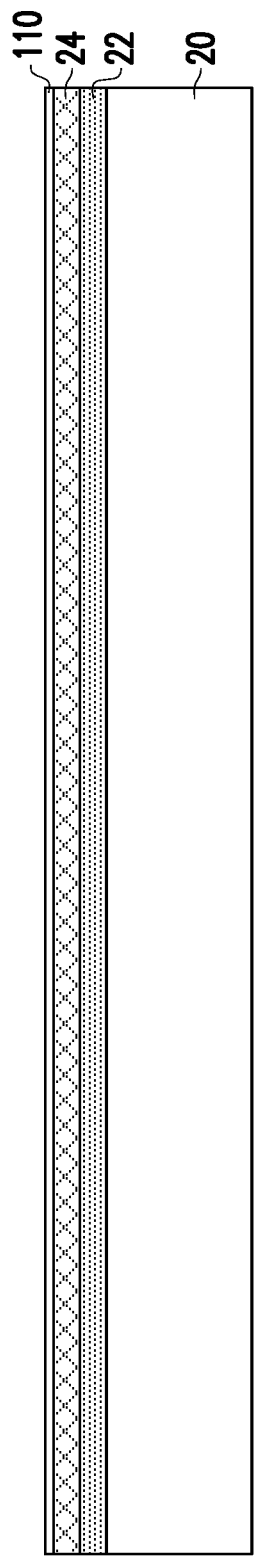

Referring to FIG. 14, release film 22 is formed on carrier 20, and dielectric layer 24 is formed over release film 22. Metal seed layer 110 is then formed on dielectric layer 24. Metal seed layer 110 may have a structure and formed of materials similar to that of metal seed layer 30 (FIG. 2). For example, metal seed layer 110 may include an adhesion layer and a copper-containing layer over the adhesion layer.

Figure 15:
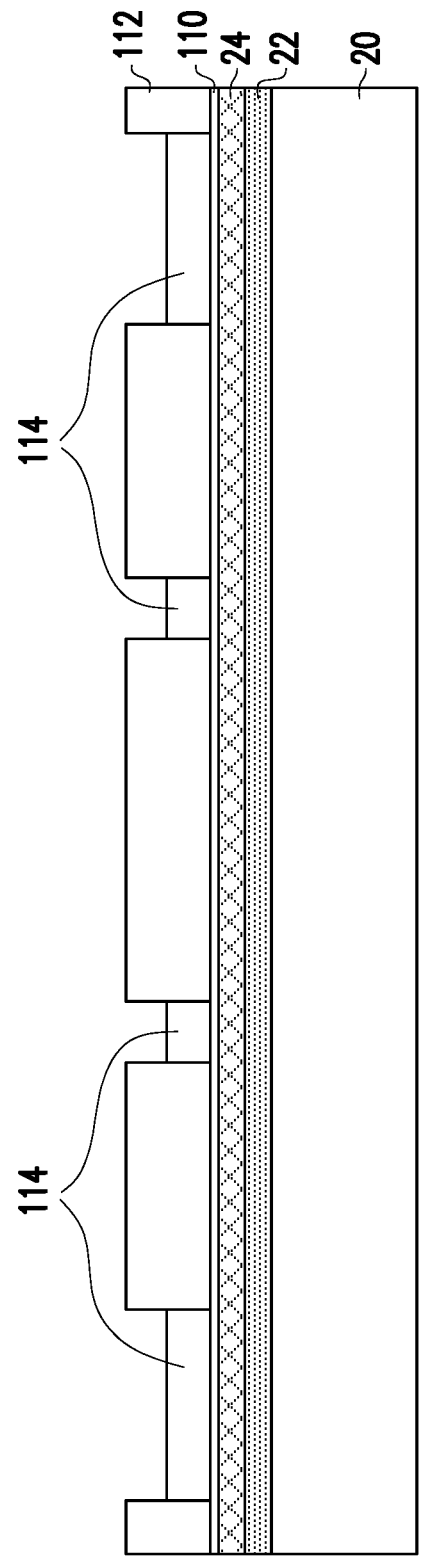
Figure 16:
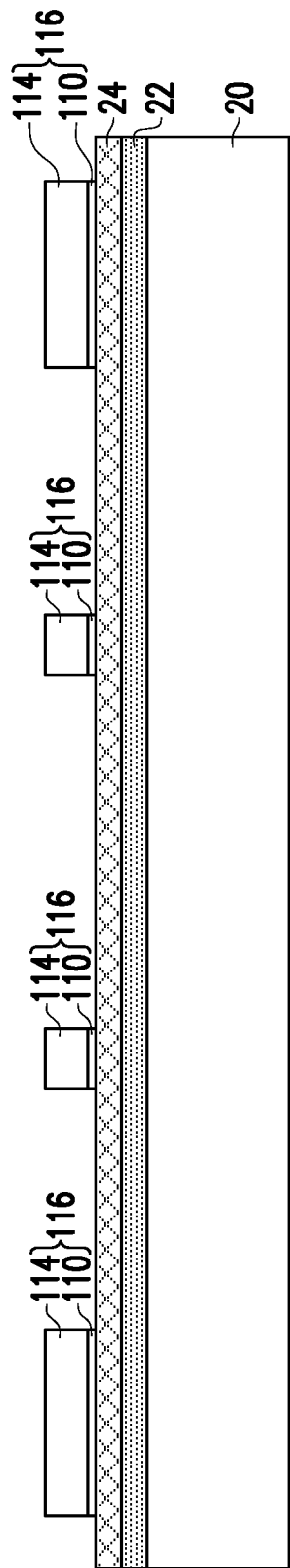

Referring to FIG. 15, patterned photo resist 112 is formed over metal seed layer 110, and some portions of metal seed layer 110 are revealed. RDLs 114 are then formed in the openings in photo resist 112, for example, through plating. RDLs 114 may be formed of copper, aluminum, aluminum copper, or the like. After RDLs 114 are formed, photo resist 112 is removed, and the portions of metal seed layer 110 previously covered by photo resist 112 are etched. The resulting structure is shown in FIG. 16. Throughout the description, RDLs 114 and the underlying remaining portions of metal seed layer 110 are in combination referred to as RDLs 116. RDLs 116 may have a thickness greater than about 3 μm. The thickness may be in the range between about 3 μm and about 10 μm.

FIG. 17 illustrates the formation of dielectric layer 118. In accordance with some embodiments of the present disclosure, dielectric layer 118 is formed of a polymer, which may also be a photo-sensitive material such as PBO, polyimide, BCB, or the like. In accordance with alternative embodiments of the present disclosure, dielectric layer 118 is formed of an inorganic material such as silicon oxide, silicon nitride, silicon oxynitride, silicon oxy-carbo-nitride, or the like.

Due to RDLs 116, which protrude higher than dielectric layer 24, the top surface of dielectric layer 118 is non planar. If a device die is adhered to the top surface of the non-planar top surface of dielectric layer 118 through a DAF, there will be voids formed between the DAF and dielectric layer 118, and the reliability of the package is adversely affected. In accordance with some embodiments of the present disclosure, as shown in FIG. 18, a planarization process such as a CMP or a mechanical grinding process is performed to planarize the top surface of dielectric layer 118.

Figure 20:
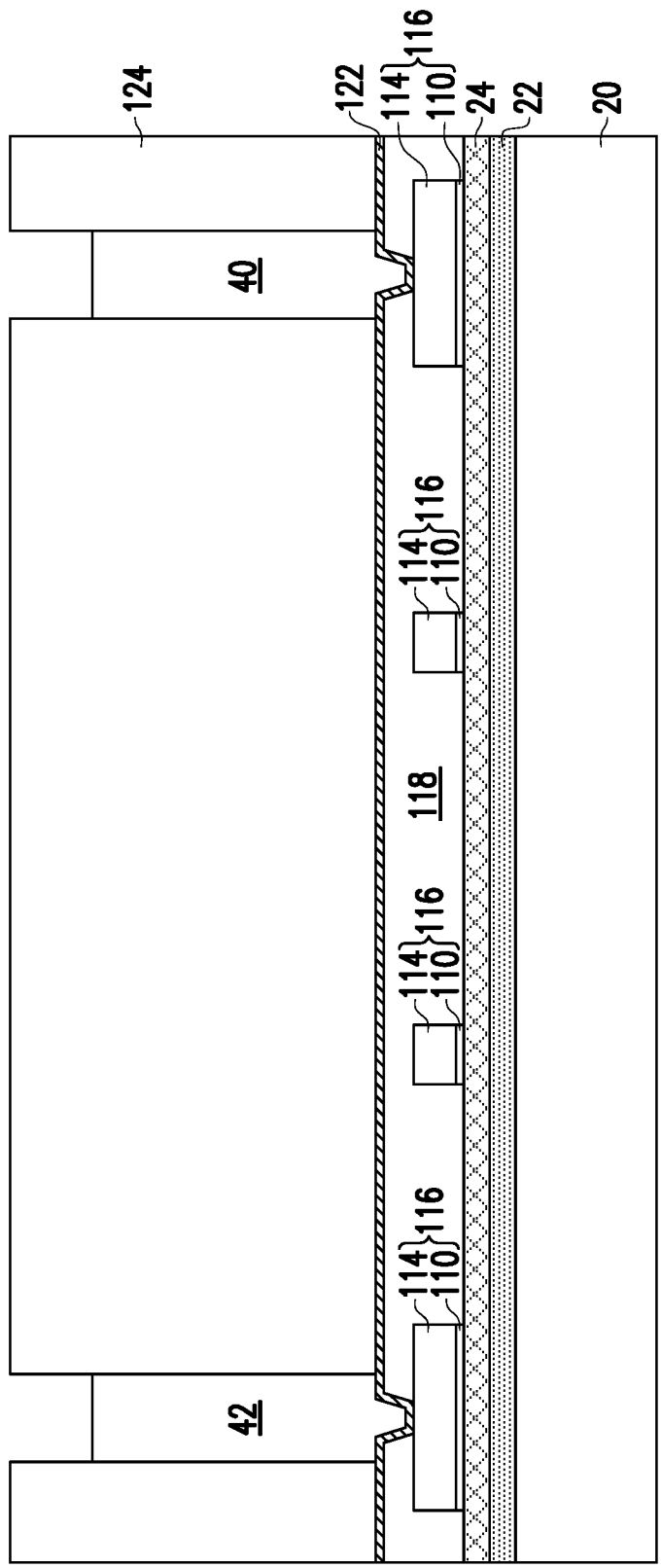

Referring to FIG. 19, openings 120 are formed in dielectric layer 118, for example, through an etching process. Some portions of RDLs 116 are thus exposed. Next, as shown in FIG. 20, metal seed layer 122 is formed. The formation methods and the materials may be selected from the same group of candidate methods and materials for forming metal seed layer 36 (FIG. 5). Patterned photo resist 124 is then formed, followed by plating metallic material 40 into the openings in photo resist 124.

Figure 21:
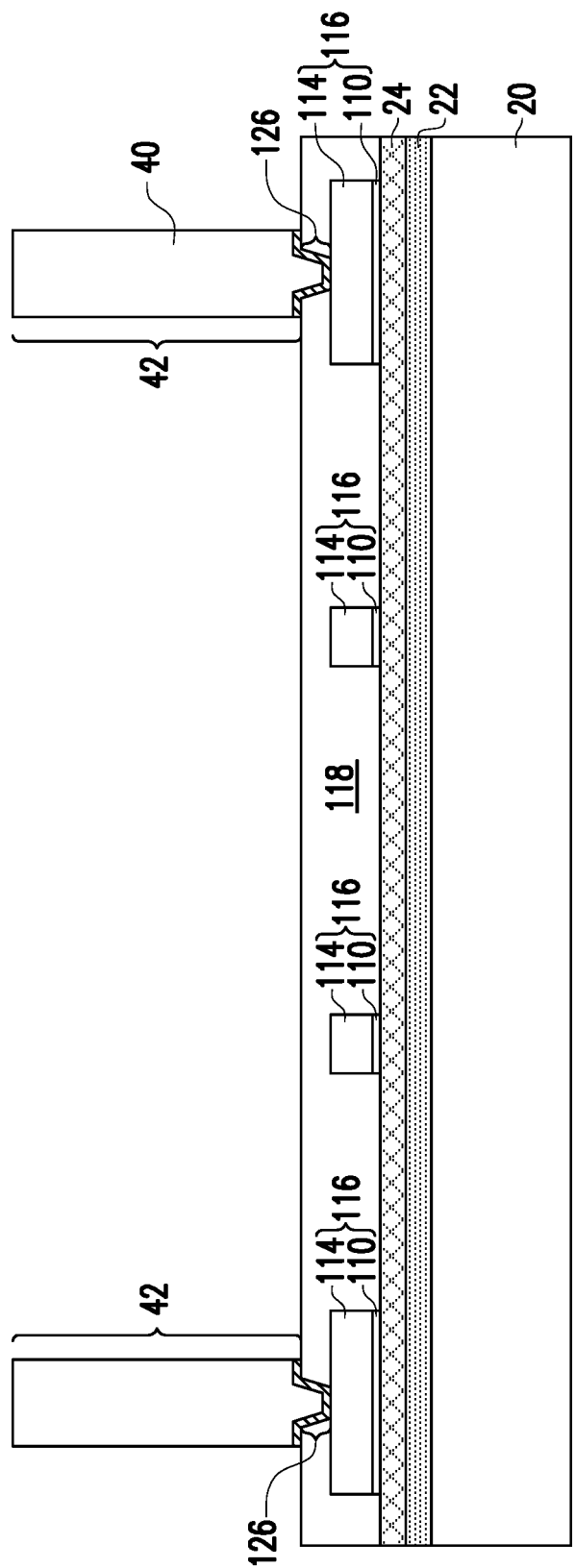

In subsequent steps, photo resist 124 is removed, and the portions of metal seed layer 122 previously covered by photo resist 124 are etched, forming metal posts (through-vias) 42 as shown in FIG. 21. Metal posts 42 include metallic material 40 (which may be formed of copper or a copper alloy) and the underlying remaining portions of metal seed layer 122. Vias 126 are also formed simultaneously as metal posts 42. Vias 126 are in dielectric layer 118, and electrically connect metal posts 42 to RDLs 116.

Figure 22:
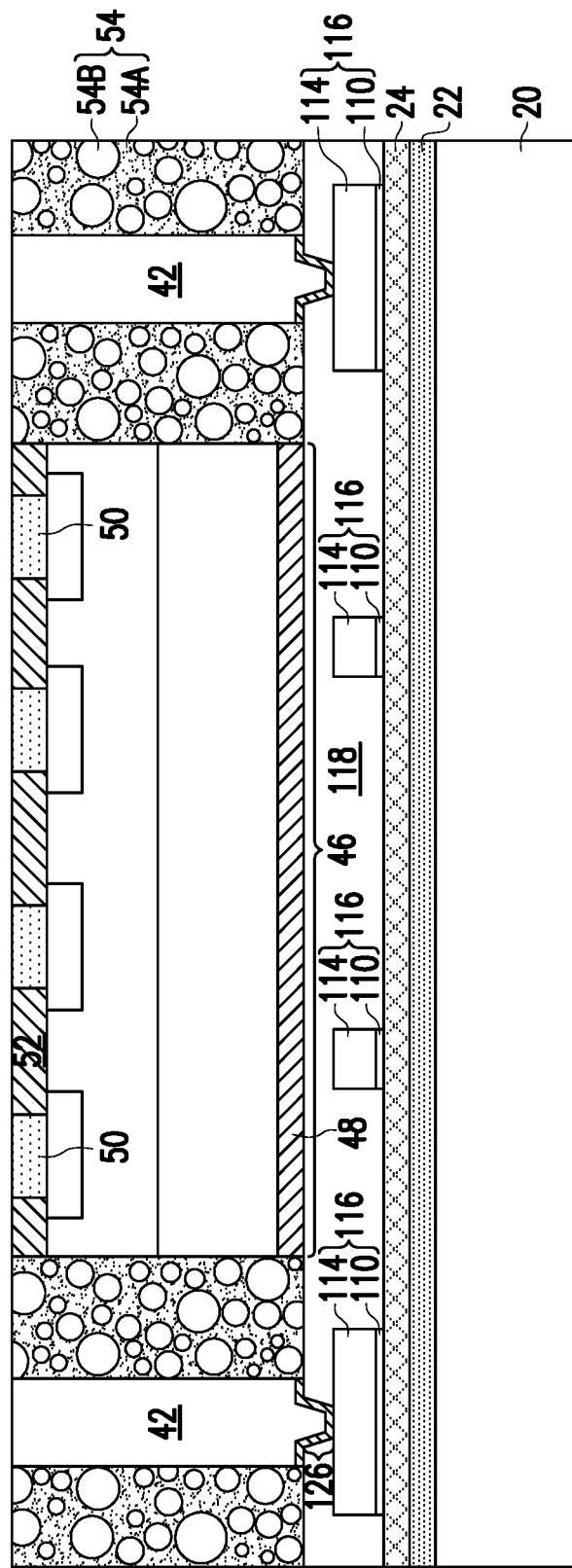
Figure 23:
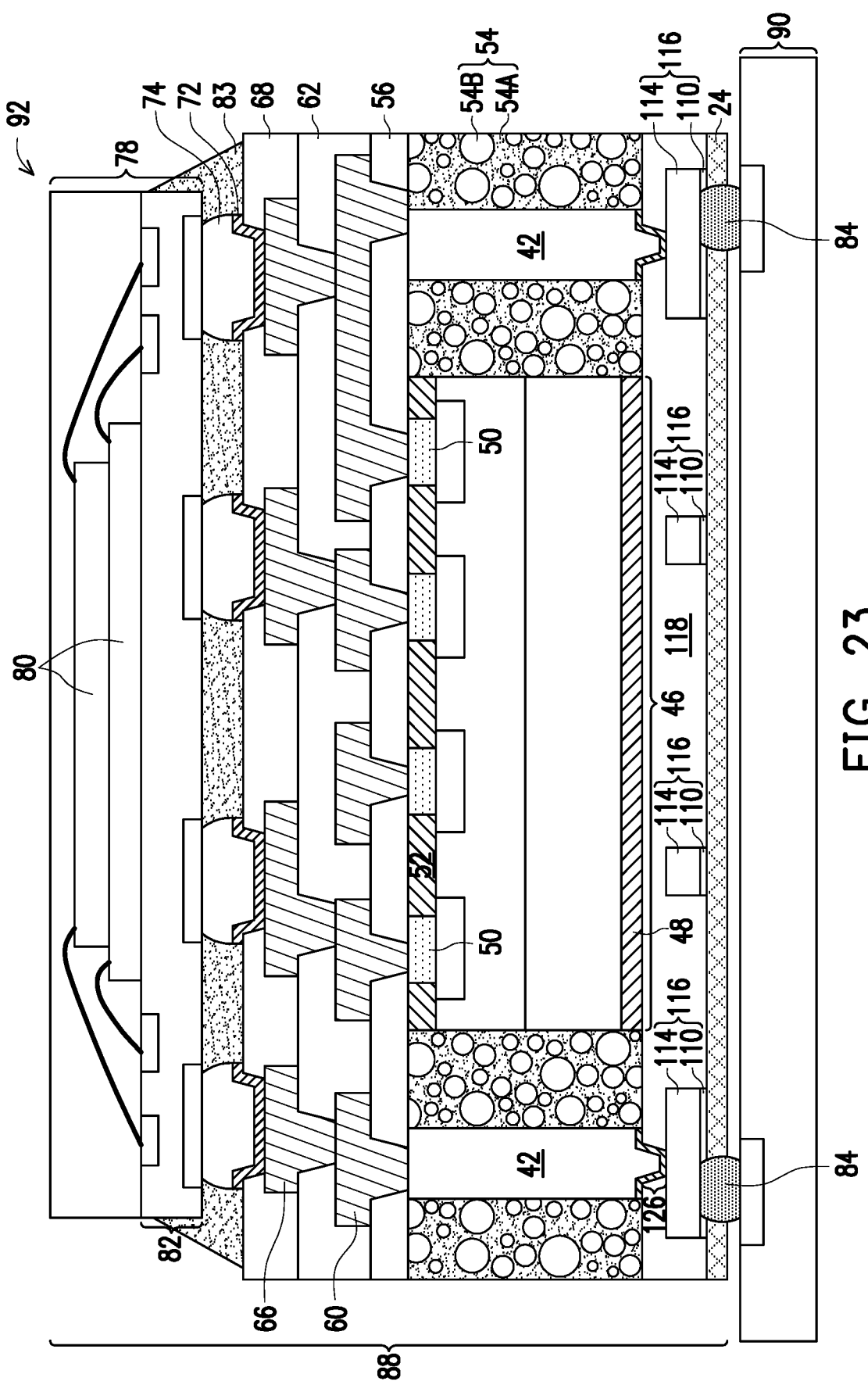

FIG. 22 illustrates the attachment of device die 46 to the planarized dielectric layer 118 through DAF 48. Next, device die 46 and metal posts 42 are encapsulated in encapsulating material 54, followed by a planarization process such as a CMP process or a mechanical grinding process to level the top surfaces of device die 46 and metal posts 42. Metal posts 42 are alternatively referred to as through-vias 42 hereinafter. In subsequent processes, the remaining processes similar to what are shown in FIGS. 9 through 13A are performed to form overlying structures, which are shown in FIG. 23. The overlying structures include RDLs 60 and 66, dielectric layers 56, 62, and 68, UBMs 72, and electrical connectors 74. Package components 78 are bonded, and a die-saw is performed to form a plurality of PoP packages identical to the illustrated PoP package 88. A PoP package 88 is bonded to package component 90, forming package 92 as shown in FIG. 23.

In above-illustrated exemplary embodiments, some exemplary processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By performing planarization processes on dielectric layers and RDLs, planar top surfaces are formed for device dies and DAFs to attach on, and hence no void (air gap) is formed between the DAFs and the underlying dielectric layer. The reliability of the package is improved.

In accordance with some embodiments of the present disclosure, a method includes forming a buffer dielectric layer over a carrier, and forming a first dielectric layer and a first redistribution line over the buffer dielectric layer. The first redistribution line is in the first dielectric layer. The method further includes performing a planarization on the first dielectric layer to level a top surface of the first dielectric layer, forming a metal post over and electrically coupling to the first redistribution line, and encapsulating the metal post in an encapsulating material. The encapsulating material contacts a top surface of the planarized top surface of the first dielectric layer. In an embodiment, the method includes forming a second dielectric layer over and contacting the encapsulating material and the metal post; forming a second redistribution line comprising a via portion extending into the second dielectric layer to connect to the metal post; forming a third dielectric layer over the second dielectric layer and the second redistribution line, wherein the third dielectric layer is not planarized; and forming a fourth dielectric layer over and contact a non-planar top surface of the third dielectric layer. In an embodiment, the forming the first redistribution line comprises: forming an opening in the first dielectric layer; forming a first seed layer extending into the opening; forming a first metallic material over the first seed layer; and planarizing the first metallic material, the first seed layer, and the first dielectric layer. In an embodiment, the forming the metal post comprises: forming a second seed layer over and contacting the first dielectric layer and the first redistribution line; forming a patterned photo resist over the second seed layer; plating a second metallic material over the second seed layer and in an opening in the patterned photo resist; and removing the patterned photo resist and portions of the second seed layer directly underlying the removed patterned photo resist. In an embodiment, the forming the first redistribution line comprises forming a first seed layer over and contacting the buffer dielectric layer; forming a patterned photo resist over the first seed layer; plating a metallic material over the first seed layer and in an opening in the patterned photo resist; and removing the patterned photo resist and portions of the first seed layer directly underlying the removed patterned photo resist, wherein the first dielectric layer is formed after the removing the patterned photo resist and the portions of the first seed layer. In an embodiment, after the planarization, an entirety of the first redistribution line is below a top surface of the planarized top surface of the first dielectric layer. In an embodiment, a third redistribution line is formed in a same process for forming the first redistribution line, and the method further comprises attaching a device die to the first dielectric layer through an adhesive film, wherein the adhesive film physically contacts a top surface of the first dielectric layer and a top surface of the third redistribution line. In an embodiment, the forming the metal post results in a recess to be formed in a top edge portion of a barrier layer of the first redistribution line.

In accordance with some embodiments of the present disclosure, a method includes forming a buffer dielectric layer over a carrier; forming a first dielectric layer over the carrier; forming a first opening and a second opening in the first dielectric layer; forming a first redistribution line and a second redistribution line in the first opening and the second opening, respectively; planarizing a top surface of the first dielectric layer; attaching a device die to the top surface of the first dielectric layer through an adhesive film, wherein the adhesive film is in physical contact with the planarized top surface of the first dielectric layer and a top surface of the first redistribution line; and encapsulating the device die in an encapsulating material. In an embodiment, the method further includes forming a metal post over and contacting the second redistribution line, the forming the metal post comprising: forming a metal seed layer over and contacting the first dielectric layer, the first redistribution line, and the second redistribution line; plating a metallic material on the metal seed layer; and removing undesirable portions of the metal seed layer, wherein all of the metal seed layer contacting the first redistribution line is removed. In an embodiment, the metal post overlaps and contacts a first portion of the second redistribution line, and the encapsulating material overlaps and contacts a second portion of the second redistribution line. In an embodiment, the forming the metal post results in a recess to be formed in a top edge portion of a barrier layer of the first redistribution line. In an embodiment, the encapsulating material contacts a top surface of the planarized top surface of the first dielectric layer. In an embodiment, in the planarizing, the first dielectric layer, the first redistribution line, and the second redistribution line are planarized.

In accordance with some embodiments of the present disclosure, a device includes a first dielectric layer; a first redistribution line and a second redistribution line in the first dielectric layer; an adhesive film over and contacting both a top surface of the first dielectric layer and a top surface of the first redistribution line; a device die over and adhered to the adhesive film; and an encapsulating material encapsulating the device die therein, wherein the encapsulating material contacts the top surface of the first dielectric layer. In an embodiment, the device further includes a through-via over and contacting a top surface of the second redistribution line, with the through-via encapsulated in the encapsulating material, wherein the through-via comprises a diffusion barrier layer and a metallic material over the diffusion barrier layer, and an entirety of the diffusion barrier layer is planar. In an embodiment, the through-via is wider than the second redistribution line, and the diffusion barrier layer extends on the top surface of the first dielectric layer. In an embodiment, the through-via is narrower than the second redistribution line, and the encapsulating material contacts the top surface of the second redistribution line. In an embodiment, the device further includes a second dielectric layer over the encapsulating material; a second redistribution line comprising a via portion extending into the second dielectric layer to connect to the device die; and a third dielectric layer over the second dielectric layer and the second redistribution line, wherein the third dielectric layer has non-planar top surface having a topology following a topology of underlying features. In an embodiment, the first redistribution line has a diffusion barrier layer, and a top edge of the diffusion barrier layer is recessed lower than the top surface of the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A structure comprising:
   a dielectric layer;
   a first redistribution line and a second redistribution line in the dielectric layer, wherein the first redistribution line comprises:
      an adhesion layer comprising a bottom portion and opposing sidewall portions over and connecting to opposing ends of the bottom portion; and
      a first metallic material over the bottom portion of the adhesion layer, wherein a first top surface of the dielectric layer and a second top surface of the first metallic material are coplanar;
   a metal post over and contacting the second top surface of the first metallic material, wherein the metal post comprises a metal seed layer, and wherein an entirety of the metal seed layer is planar;

an adhesive film over and contacting both the first top surface of the dielectric layer and a third top surface of the second redistribution line;

a device die over the dielectric layer and the adhesive film; and an encapsulant encapsulating the device die and the metal post therein.

2. The structure of claim 1, wherein the metal seed layer is in physical contact with the first top surface of the dielectric layer.

3. The structure of claim 1, wherein the encapsulant comprises a bottom surface comprising:

a first portion contacting the first top surface of the dielectric layer; and a second portion contacting the second top surface of the first redistribution line.

4. The structure of claim 1 further comprising an air gap underlying the adhesive film, and the air gap is between the dielectric layer and a second metallic material of the second redistribution line.

5. The structure of claim 4, wherein the air gap is in contact with a sidewall of the second metallic material of the second redistribution line.

6. The structure of claim 1, wherein the encapsulant contacts the first top surface of the dielectric layer.

7. The structure of claim 6, wherein the opposing sidewall portions are recessed to form recesses, and the encapsulant extends into the recesses.

8. The structure of claim 1 further comprising:

a buffer dielectric layer underlying and contacting the dielectric layer; and a solder feature penetrating through the buffer dielectric layer to contact a bottom surface of the first redistribution line.

9. A structure comprising:

a first dielectric layer;

a first redistribution line in the first dielectric layer, the first redistribution line comprising:

an adhesion layer comprising a bottom portion and sidewall portions connecting to the bottom portion; and a metallic material over the bottom portion of the adhesion layer;

a second redistribution line in the first dielectric layer;

a molding compound over and contacting the first dielectric layer;

a through-via penetrating through the molding compound, wherein the through-via contacts both of the first dielectric layer and the metallic material of the first redistribution line;

a die-attach film over and contacting the first dielectric layer and the second redistribution line; and a device die over and contacting the die-attach film, wherein the device die is in the molding compound.

10. The structure of claim 9, wherein top surfaces of the first redistribution line and the first dielectric layer are coplanar.

11. The structure of claim 9, wherein top surfaces of the through-via and the molding compound are coplanar.

12. The structure of claim 9 further comprising an air gap in a region defined by a first sidewall of the second redistribution line, a second sidewall of the first dielectric layer, and a bottom surface of the die-attach film.

13. The structure of claim 12, wherein the second redistribution line comprises an additional adhesion layer, and wherein the air gap is directly over a portion of the additional adhesion layer of the second redistribution line.

14. The structure of claim 13, wherein the second redistribution line comprises an additional metallic material, wherein the air gap is in contact with a sidewall of the additional metallic material.

15. The structure of claim 9 further comprising a second dielectric layer underlying and contacting the first dielectric layer, wherein a bottom surface of the first redistribution line is coplanar with an interface between the first dielectric layer and the second dielectric layer.

16. The structure of claim 9, wherein the through-via comprises a seed layer, and a copper-containing layer over the seed layer, and wherein an entirety of the seed layer is in the molding compound.

17. A structure comprising:

a metal post;

an adhesive film;

a device die over and contacting the adhesive film;

a molding compound molding the metal post, the adhesive film, and the device die therein, wherein bottom surfaces of the molding compound, the metal post, and the adhesive film form a substantially coplanar bottom surface;

a dielectric layer;

a first redistribution line in the dielectric layer, wherein the first redistribution line comprises:

an adhesion layer comprising a bottom portion and sidewall portions connecting to the bottom portion; and a metallic material over the bottom portion of the adhesion layer, wherein top surfaces of the dielectric layer and the metallic material of the first redistribution line form a substantially coplanar top surface, and wherein the substantially coplanar bottom surface is in contact with the substantially coplanar top surface; and a second redistribution line in the dielectric layer and in contact with the adhesive film.

18. The structure of claim 17, wherein the first redistribution line and the dielectric layer comprise bottom surfaces that are coplanar with each other.

19. The structure of claim 17 further comprising an air gap between the second redistribution line and the dielectric layer.

20. The structure of claim 19, wherein the air gap is in contact with a bottom surface of the adhesive film.

* * * * *